(12) United States Patent
Finney et al.

(10) Patent No.: US 10,199,490 B2
(45) Date of Patent: *Feb. 5, 2019

(54) SEMICONDUCTOR DEVICE WITH A GUARD STRUCTURE AND CORRESPONDING METHODS OF MANUFACTURE

(71) Applicant: Infineon Technologies AG, Neubiberg (DE)

(72) Inventors: Adrian Finney, Villach (AT); Radu Eugen Cazimirovici, Bucharest (RO); Dietmar Kotz, Villach (AT); Thomas Ostermann, Velden am Woerthersee (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 15/915,890

(22) Filed: Mar. 8, 2018

(65) Prior Publication Data

US 2018/0197982 A1     Jul. 12, 2018

Related U.S. Application Data

(63) Continuation of application No. 15/627,481, filed on Jun. 20, 2017, now Pat. No. 9,941,402.

(30) Foreign Application Priority Data

Jun. 28, 2016   (DE) ........................ 10 2016 111 836

(51) Int. Cl.
*H01L 29/78* (2006.01)
*H01L 27/08* (2006.01)
(Continued)

(52) U.S. Cl.
CPC ........ *H01L 29/7811* (2013.01); *H01L 21/263* (2013.01); *H01L 21/823481* (2013.01);
(Continued)

(58) Field of Classification Search
CPC ... H01L 29/78; H01L 29/781; H01L 29/7811; H01L 29/10; H01L 29/109;
(Continued)

(56) References Cited

U.S. PATENT DOCUMENTS 6,800,952 B2   10/2004   Blackburn et al.
9,013,015 B2    4/2015   Doelle
(Continued)

FOREIGN PATENT DOCUMENTS

DE        102015112728 A1    2/2016

*Primary Examiner* — Monica D Harrison
(74) *Attorney, Agent, or Firm* — Murphy, Bilak & Homiller, PLLC

(57) ABSTRACT

A semiconductor device includes a guard structure located laterally between a first active area of a semiconductor substrate and a second active area of the semiconductor substrate. The guard structure includes a first doping region located at a front side surface of the semiconductor substrate, and a wiring structure electrically connecting the first doping region to a highly doped portion of a common doping region. The common doping region extends from a backside surface of the semiconductor substrate to at least a part of the front side surface of the semiconductor substrate in contact with the wiring structure of the guard structure. Corresponding methods for forming the semiconductor device are also described.

20 Claims, 7 Drawing Sheets

(51) Int. Cl.
*H01L 21/82* (2006.01)
*H01L 21/263* (2006.01)
*H01L 21/8234* (2006.01)
*H01L 27/088* (2006.01)
*H01L 29/06* (2006.01)
*H01L 29/10* (2006.01)
*H01L 29/36* (2006.01)
*H01L 29/66* (2006.01)

(52) U.S. Cl.
CPC .... *H01L 21/823487* (2013.01); *H01L 27/088* (2013.01); *H01L 29/0619* (2013.01); *H01L 29/1095* (2013.01); *H01L 29/36* (2013.01); *H01L 29/66712* (2013.01)

(58) Field of Classification Search
CPC ..... H01L 29/1095; H01L 29/36; H01L 29/06; H01L 29/061; H01L 29/0619; H01L 27/08; H01L 27/088; H01L 21/26; H01L 21/263; H01L 21/82; H01L 21/823; H01L 21/8234; H01L 21/82348; H01L 21/823481; H01L 21/823487
USPC .......................................................... 257/329
See application file for complete search history.

(56) References Cited

U.S. PATENT DOCUMENTS

| 9,941,402 B2 * | 4/2018 | Finney ................ H01L 29/7811 |
| 2012/0139087 A1 | 6/2012 | Yoshihisa et al. |
| 2016/0056280 A1 | 2/2016 | Finney et al. |

* cited by examiner

SEMICONDUCTOR DEVICE WITH A GUARD STRUCTURE AND CORRESPONDING METHODS OF MANUFACTURE

TECHNICAL FIELD

Embodiments relate to guard structures in semiconductor devices and in particular to semiconductor devices and methods for forming semiconductor devices.

BACKGROUND

Over the past decades, the integration density of circuit elements in semiconductor devices and integrated circuits has rapidly grown and an end towards this trend is neither in sight nor to be expected in future. More and more functionality comprising different kinds of circuits, such as logic circuits, power devices, analog circuits, signal processing circuits etc. are integrated on a single chip. To achieve high integration densities, the different circuits comprised in an integrated circuit are often in close proximity to each other and may hence disturb each other's operation. Guard structures may be employed to shield different circuits or different circuit parts from one another in order to provide more reliable operation of the semiconductor device.

SUMMARY

There may be a demand to provide an improved concept for semiconductor devices, which may allow to provide higher integration densities of semiconductor devices. This can allow integrating more functionality into a semiconductor device of the same size, or can reduce area consumption and size of the semiconductor device, which for example, may allow a more cost efficient production of the semiconductor device.

Some embodiments relate to a semiconductor device comprising a guard structure. The guard structure is located laterally between a first active area of a semiconductor substrate of the semiconductor device and a second active area of the semiconductor substrate. The guard structure comprises a first doping region located at a front side surface of the semiconductor substrate and a wiring structure. The wiring structure electrically connects the first doping region of the guard structure to a highly doped portion of a common doping region. The common doping region extends from a backside surface of the semiconductor substrate to at least a part of the front side surface of the semiconductor substrate in contact with the wiring structure of the guard structure. Furthermore, the semiconductor device comprises an edge termination doping region. The edge termination doping region laterally surrounds the first active area and the second active area. The edge termination doping region and the first doping region of the guard structure comprise a first conductivity type. The common doping region comprises a second conductivity type. A resistive connection exists between the edge termination doping region and the first doping region of the guard structure at least during occurrence of reverse operating conditions of the semiconductor device.

Some embodiments relate to a method for forming a semiconductor device. The method comprises forming an edge termination doping region laterally surrounding a first active area of a semiconductor substrate of the semiconductor device and a second active area of the semiconductor substrate of the semiconductor device and forming a first doping region of a guard structure located at a front side surface of the semiconductor substrate. Furthermore, the method comprises forming a wiring structure of the guard structure. The wiring structure of the guard structure electrically connects the first doping region of the guard structure to a highly doped portion of a common doping region. The common doping region extends from a backside surface of the semiconductor substrate to at least a part of the front side surface of the semiconductor substrate in contact with the wiring structure of the guard structure. The guard structure is located laterally between the first active area and the second active area. The edge termination doping region and the first doping region of the guard structure comprise a first conductivity type. The common doping region comprises a second conductivity type. A resistive connection exists between the edge termination doping region and the first doping region of the guard structure at least during occurrence of reverse operating conditions of the semiconductor device.

Those skilled in the art will recognize additional features and advantages upon reading the following detailed description, and upon viewing the accompanying drawings.

BRIEF DESCRIPTION OF THE FIGURES

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
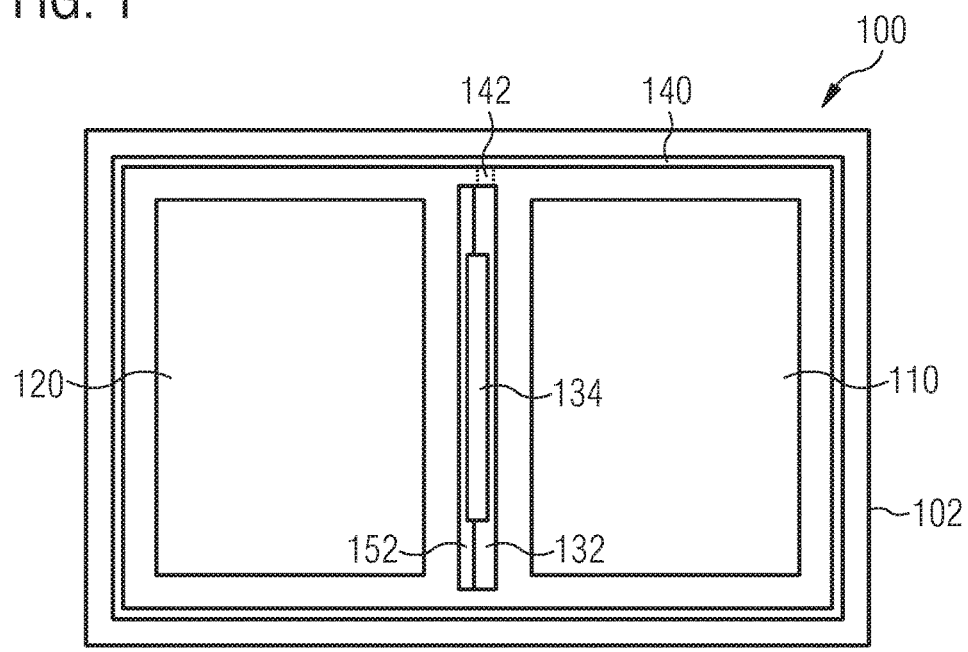
FIG. 1 shows a schematic top view of a semiconductor device comprising a guard structure and an edge termination doping region.

FIG. 1 shows a top view of a semiconductor device 100 according to an embodiment. The guard structure is located laterally between a first active area 110 of a semiconductor substrate 102 of the semiconductor device 100 and a second active area 120 of the semiconductor substrate 102. The guard structure comprises a first doping region 132 located at a front side surface of the semiconductor substrate 102 and a wiring structure 134. The wiring structure 134 electrically connects the first doping region 132 of the guard structure to a highly doped portion 152 of a common doping region. The common doping region extends from a backside surface of the semiconductor substrate 102 to at least a part of the front side surface of the semiconductor substrate 102 in contact with the wiring structure 134 of the guard structure. Furthermore, the semiconductor device 100 comprises an edge termination doping region 140. The edge termination doping region 140 laterally surrounds the first active area 110 and the second active area 120. The edge termination doping region 140 and the first doping region 132 of the guard structure comprise a first conductivity type. The common doping region comprises a second conductivity type. A resistive connection 142 exists between the edge termination doping region 140 and the first doping region 132 of the guard structure at least during occurrence of reverse operating conditions of the semiconductor device 100.

By resistively connecting an edge termination doping region of a semiconductor substrate of a semiconductor device with a first doping region of a guard structure of the semiconductor substrate at least during occurrence of reverse operating conditions of the semiconductor device, an enhanced cross current or parasitic current protection within the semiconductor substrate between a first active area and a second active area of the semiconductor substrate may be provided. Due to the enhanced cross current protection it may be possible to reduce a lateral spacing between the first active area and the second active area, which may hence reduce die-size of the semiconductor device. A smaller semiconductor device requires less space on a circuit board and may be used in applications where required space of the semiconductor device is a limitation. Semiconductor devices of reduced die-size may also allow arranging more semiconductor devices on a common wafer during production, which may lead to higher yield and hence to a more cost-efficient production.

Further, the resistive connection 142 between the edge termination doping region 140 and the first doping region 132 of the guard structure may provide a cross current protection function. Due to the resistive connection 142 the edge termination doping region 140 may be electrically coupled to the first doping region 132 of the guard structure, such that a cross current protection function of the first doping region 132 of the guard structure may be extended to the edge termination doping region 140. For example, the edge termination doping region 140 may then be employed together with the first doping region 132 of the guard structure to suppress parasitic currents flowing from the first active area 110 towards the second active area 120 of the semiconductor substrate 102 (or flowing from the second active area 120 towards the first active area 110). These parasitic currents may comprise parasitic minority charge carriers injected from, for example, the first active area 110 into the common doping region. The injected parasitic minority charge carriers may then travel towards the second active area 120 during the occurrence of reverse operating conditions of the semiconductor device 100, where the parasitic minority charge carriers could interfere with the functionality of the second active area 120. However, the parasitic minority charge carriers may be intercepted by the first doping region 132 of the guard structure, and, if the edge termination doping region 140 is coupled by a resistive connection 142 to the first doping region 132 of the guard structure, the parasitic minority charge carriers may also be intercepted by the edge termination doping region 140, such that an enhanced cross current protection within the semiconductor substrate 102 between the first active area 110 and the second active area 120 may be provided. The first doping region 132 of the guard structure is connected by a wiring structure 134 to a highly doped portion 152 of the common doping region to enable a recombination of the parasitic minority charge carriers and hence a suppression of the parasitic currents, for example. As the common doping region is of an opposite conductivity type as the first doping region 132 of the guard structure and the edge termination doping region 140, the common doping region may provide charge carriers of opposite polarity to the first doping region 132 of the guard structure and to the edge termination doping region 140 via the wiring structure 134. The parasitic minority charge carriers intercepted by the first doping region 132 of the guard structure and/or intercepted by the edge termination doping region 140 may then recombine with the charge carriers of opposite polarity provided by the common doping region. As a result, parasitic currents flowing from the first active area 110 towards the second active area 120 (or vice versa) may be reduced and/or suppressed.

At the backside surface of the semiconductor substrate 102 the common doping region may, for example, be connected to a backside electrode. During at least the occurrence of reverse operating conditions of the semiconductor device 100, charge carriers of opposite polarity to the parasitic minority charge carriers may be provided to the common doping region in course of an electric potential (e.g., a voltage source and/or a current source) applied to the backside electrode, such that a sufficient amount of charge carriers of opposite polarity may be available to recombine with the parasitic minority charge carriers at least during the occurrence of reverse operating conditions of the semiconductor device 100.

Referring to FIG. 1, the guard structure, e.g., at least the first doping region 132 of the guard structure, extends laterally between the first active area 110 and the second active area 120 of the semiconductor substrate 102, such that the first active area 110 may be laterally located at one side of the first doping region 132 of the guard structure and the second active area 120 may be located at an opposite side of the first doping region 132 of the guard structure. The first doping region 132 may be (directly) adjacent to the common doping region (e.g., adjacent to the highly doped portion 152 of the common doping region). The highly doped portion 152 of the common doping region may extend laterally in parallel to the first doping region 132 of the guard structure. This may enhance the cross current protection (e.g., the reduction of parasitic currents) provided by the guard structure. Optionally, the first doping region 132 and the highly doped portion 152 of the common doping region may be located laterally directly between the first active area 110 and the second active area 120.

The first doping region 132 of the guard structure, the highly doped portion 152 of the common doping region, and the wiring structure 142 electrically connecting the first doping region 132 of the guard structure and the highly doped portion 152 of the common doping region may, for example, provide a minority charge carrier conversion structure and/or may be comprised by a minority charge carrier conversion structure of the semiconductor device 100. Such a minority charge carrier conversion structure may be configured to reduce parasitic currents due to parasitic minority charge carriers between the first active area 110 and the second active area 120 of the semiconductor substrate 102 similarly to the description above.

For example, the common doping region comprises a portion located at the first active area 110 and a portion located at the second active area 120 of the semiconductor substrate 102. For example, the common doping region may represent at least one of a bulk region, a drift region, a backside doping region, an emitter (or collector) doping region, and/or a drain (or source) doping region of one or more electrical element structures located at the first and/or second active area. For example, the common doping region is a region of the semiconductor substrate comprising the second conductivity type and extending laterally along the (whole) backside of the semiconductor substrate and extending vertically to the front side of the semiconductor substrate at some areas of the front side surface of the semiconductor substrate.

The edge termination doping region 140 laterally surrounding the first active area 110 and the second active area 120 may be adjacent to the common doping region and may be located at the front side surface of the semiconductor substrate. Alternatively, the edge termination doping region 140 may be buried within the semiconductor substrate (e.g. within the common doping region) located at some vertical distance from the front side surface of the semiconductor substrate (e.g., at vertical distance larger than 500 nm or larger than 1 µm and smaller than 10 µm or smaller than 5 µm). A portion of the common doping region (e.g., the heavily doped portion 152) may be located at the front side surface of the semiconductor substrate 102 laterally between the edge termination doping region 140 and the active area 110 and/or may be located laterally between the edge termination doping region 140 and the second active area 120.

A resistive connection may be an electrical connection that is substantially governed by Ohm's law, e.g., a voltage across the resistive connection is substantially proportional to a current flowing through the resistive connection. A resistive connection may comprise electrically conductive materials (e.g., metals) and/or doped semiconductor material, for example, comprising an electrical resistivity ρ smaller than $1*10^4$ Ωm, or smaller than $1*10^2$ Ωm, or smaller than $1*10^1$ Ωm, smaller than $1*10^{-3}$ Ωm, or even smaller than $1*10^{-5}$ Ωm. A resistive connection may exclude insulating materials interrupting the resistive path of the resistive connection. A resistive connection may also be provided within a semiconductor substrate by applying bias voltages to the semiconductor substrate, which may, for example, result in a higher concentration of charge carriers within certain portions of the semiconductor substrate, so that these portions of the semiconductor material may serve as resistive connections in a specific operating state. Bias voltages applied to semiconductor substrate may also forward bias p-n junctions that may hence become resistive connections. Furthermore, bias voltages may create depletion regions and hence electric fields within the semiconductor substrate, so that also depletion regions may under certain conditions (e.g., in the presence of minority charge carriers) serve as resistive connections within the semiconductor substrate.

The first doping region 132 of the guard structure may, for example, be in contact with the edge termination doping region 140 to short circuit the first doping region 132 of the guard structure and the edge termination doping region 140. For example, the first doping region 132 of the guard structure may be in direct contact with the edge termination doping region 140 in a manner, that the first doping region 132 of the guard structure may laterally contact the edge termination doping region 140. This lateral contact may be located at the front side surface of the semiconductor substrate or may be buried within the semiconductor substrate. In one of these ways, the first doping region 132 of the guard structure may form together with the edge termination doping region 140 a continuous doping region of the first conductivity type. Alternatively, a small lateral gap (e.g., comprising semiconductor material of the second conductivity type) may exist between the edge termination doping region and the first doping region of the guard structure. The resistive connection 142 between the edge termination doping region 140 and the first doping region 132 of the guard structure may, for example, exist during any operating condition of the semiconductor device 100. Parasitic minority charge carriers intercepted by the edge termination doping region 140 may then flow through the first doping region 132 to the wiring structure 134 and/or to the highly doped portion 152 of the common doping region, where they may recombine with charge carriers of opposite polarity. Additionally, parasitic minority charge carriers intercepted by the edge termination doping region 140 may be swept into the wiring structure 134 whilst a balancing current of charge carriers of opposite polarity may be injected from the first doping region 132 into the wiring structure 134 of the guard structure.

For instance, the edge termination doping region 140 may be hard-wired to the first doping region 132 of the guard structure. Hard-wiring the edge termination doping region 140 to the first doping region 132 of the guard structure may comprise a direct physical contact between the edge termination doping region 140 and the first doping region 132 of the guard structure within the semiconductor substrate 102 and/or may comprise a guard-to-edge wiring structure located for example in a wiring layer stack above the semiconductor substrate 102. The guard-to-edge wiring structure may comprise an electrically conductive planar wiring element and at least two vertical wiring elements (e.g., vias filled with or lined with electrically conductive material) to resistively connect (e.g. to short circuit) the edge termination doping region 140 with the first doping region 132 of the guard structure. For example, the wiring structure of the guard structure connecting the first doping region 132 of the guard structure to a highly doped portion 152 may be used to connect the edge termination doping region 140 as well.

For example, the wiring structure 134 of the guard structure, which electrically connects the first doping region 132 of the guard structure to the highly doped portion 152 of the common doping region, may be in contact with the edge termination doping region 140. Thus, the above mentioned guard-to-edge wiring structure may, for instance, be comprised by the wiring structure 134 of the guard structure. This may allow the common doping region (e.g. the highly doped portion 152 of the common doping region) to provide charge carriers of opposite polarity to the parasitic minority charge carriers intercepted by the edge termination doping region 140 via the wiring structure 134 of the guard structure. Additionally, the parasitic minority charge carriers intercepted by the edge termination doping region 140 may directly flow into the wiring structure 134 of the guard structure. Both of these effects may result in a faster and more efficient recombination of the parasitic minority charge carriers, which in turn may enhance the cross current protection function of the edge termination doping region 140.

By hard-wiring the edge termination doping region 140 to the first doping region 132 of the guard structure, the edge termination doping region 140 may be resistively connected to the first doping region 132 of the guard structure even when the semiconductor device 100 is in a power saving mode of operation, switched off, and/or disconnected from any supply voltages.

Alternatively, the resistive connection between the first doping region 132 of the guard structure and the edge termination doping region 140 may exist under reverse operating conditions only, while no resistive connection between the first doping region 132 of the guard structure and the edge termination doping region 140 exists in other operating states (e.g. forward operating state, blocking state or conductive state) of the semiconductor device. For example, alternatively to a direct contact between the first doping region 132 of the guard structure and the edge termination doping region 140 or to a guard-to-edge wiring structure connecting the first doping region 132 of the guard structure and the edge termination doping region 140, the first doping region 132 of the guard structure may be laterally separated from the edge termination doping region 140. A minimal lateral distance between the first doping region 132 of the guard structure and the edge termination doping region 140 may, for example be less than 100 nm (or less than 50 nm, or less than 20 nm or less than 10 nm) and may be larger than zero (or larger than 5 nm, or larger than 10 nm). For example, a portion of the common doping region may laterally separate the first doping region 132 of the guard structure from the edge termination doping region 140. In this way, by the very short lateral distance between the first doping region 132 of the guard structure and the edge termination doping region 140 a resistive connection between the first doping region 132 of the guard structure and the edge termination doping region 140 may exist during the occurrence of reverse operating conditions of the semiconductor device 100. The lateral distance between the first doping region 132 of the guard structure and the edge termination doping region 140 may, for example, be bridged by merged depletion region and/or by a conductive channel at least during the occurrence of reverse operating conditions of the semiconductor device 100.

For example, a part (e.g., a first lateral part) of the edge termination doping region 140 and the first doping region 132 of the guard structure may, for example, laterally surround the first active area 110 of the semiconductor substrate 102. This may provide a cross current protection (e.g., a reduction of parasitic currents flowing into or out of the first active area 110) at all lateral boarders of the first active area 110. Additionally or alternatively, another part (e.g. a second lateral part) of the edge termination doping region 140 and the first doping region 132 of the guard structure may, for example, laterally surround the second active area 120 of the semiconductor substrate 102. In this way, a cross current protection at all lateral boarders of the second active area 120 may be provided.

For example, the edge termination doping region 140 may be in shape of a ring (loop) laterally surrounding the first active area 110 and the second active area 120. A first resistive connection may then connect the first doping region 132 of the guard structure at a first end of the first doping region 132 of the guard structure to the edge termination doping region 140 at a first location at the edge termination doping region 140 and an additional second resistive connection may connect the first doping region 132 of the guard structure at a second end of the first doping region 132 of the guard structure to the edge termination doping region 140 at a second, different location (e.g., opposite side) at the edge termination doping region 140. The first resistive connection and/or the second resistive connection may, for example, be implemented as a direct contact between the first doping region 132 of the guard structure and the edge termination doping region 140. The above mentioned first part of the edge termination doping region 140 may, for example, laterally extend at least from the first location at the edge termination doping region 140) to the second location at the edge termination doping region 140 in clockwise circumferential direction along the edge termination doping region 140 and the above mentioned second lateral part of the edge termination doping region 140 may laterally extend at least from the second location at the edge termination doping region 140 to the first location at the edge termination doping region 140 in clockwise circumferential direction along the edge termination doping region 140. In other words, a region of the semiconductor substrate 102 laterally surrounded by the edge termination doping region 140 may be divided by the first doping region 132 of the guard structure into a first portion comprising the first active area 110 and a second portion comprising the second active area 120.

Furthermore, the edge termination doping region 140 may laterally surround all active areas of the semiconductor device 100. For example, the edge termination doping region 140 may extend in a ring-shape along the outer edges of the semiconductor substrate 102. If the semiconductor substrate 102 comprises more than two active areas, the different active areas may all together be laterally surrounded by the ring-shaped edge termination doping region 140 and a guard structure as described above, or plurality of such kind of guard structures, may laterally separate some (e.g., active areas comprising sensitive parts of a circuit) or all of the different active areas from one another, so that an enhanced cross current protection may be provided between the respective active areas within the semiconductor substrate. The first doping region 132 of the guard structure (or the first doping regions of the plurality of guard structures) may then be resistively connected to the ring-shaped edge termination doping region 140 at one or more locations on the edge termination doping region 140.

Optionally, the highly doped portion 152 of the common doping region may laterally surround the first active area 110 or the second active area 120 of the semiconductor substrate 102. In this way, charge carriers of opposite polarity to the parasitic minority charge carriers intercepted by the edge termination doping region 140 and/or by the first doping region 132 of the guard structure may be provided to the highly doped portion 152 of the common doping region laterally surrounding the first active area and/or the second active area, respectively. This may reduce the lifetime of the parasitic minority charge carriers flowing towards the first active area 110 and/or the second active area 120, respectively, around the first active area 110 and/or around the second active area 120, respectively, such that the cross current protection laterally around the first active area 110 and/or laterally around the second active area 120, respectively, may be enhanced.

Moreover, the highly doped portion 152 of the common doping region laterally surrounding the first active area 110 and/or the second active area 120 may additionally serve as a channel-stop region laterally around the first active area 110 and/or laterally around the second active area 120, respectively, such that an extra channel-stop region for the first active area 110 and/or for the second active area 120 may become unnecessary and space on the semiconductor substrate 102 may be saved.

The common doping region may comprise an additional second highly doped portion. The first highly doped portion 152 of the common doping region may be located laterally between the first doping region 132 of the guard structure and the first active area 110, whereas the second highly doped portion of the common doping region may be located laterally between the first doping region 132 of the guard structure and the second active area 120. This may further enhance the cross current protection provided by the guard structure within the semiconductor substrate 102.

For example, the wiring structure 142 that electrically connects the first doping region 132 of the guard structure with the highly doped portion 152 of the common doping region is located in a wiring layer stack of the semiconductor substrate 102. The wiring structure 142 may, for example, comprise at least one lateral wiring element (e.g., a wiring line or an electrically conductive plane) located in a lateral wiring layer (e.g., metal layer) of the wiring layer stack of the semiconductor substrate 102. Moreover, the wiring structure 142 may comprise at least two vertical wiring elements (e.g., vias). At least one vertical wiring element may extend from the lateral wiring element to the first doping region 132 of the guard structure and at least one vertical wiring element may extend from the lateral wiring element to the highly doped portion 152 of the common doping region.

If the common doping region comprises optionally a first and a second highly doped portion that are laterally located at opposite sides of the first doping region 132 of the guard structure, the wiring structure 134 may electrically connect the first and the second highly doped portion of the common doping region to the first doping region 132 of the guard structure and may hence comprise at least three vertical wiring elements.

Optionally, the wiring structure 134 of the guard structure may laterally surround the first active area 110 and/or the second active area 120. The wiring structure 134 of the guard structure may comprise one or more vertical wiring elements (e.g., vias) to electrically contact the edge termination doping region 140 continuously or in regular or irregular intervals along the edge termination doping region 140. The highly doped portion 152 of the common doping region additionally laterally surrounds the first active area 110 and/or the second active area 120, respectively, the wiring structure 134 of the guard structure may connect the highly doped portion 152 of the common doping region continuously or in regular or irregular intervals to the edge termination doping region 140 along the circumference of the edge termination doping region 140 as well. This may increase the current density of charge carriers of opposite polarity to the parasitic minority charge carriers laterally around the first active area 110 and/or laterally around the second active area 120, respectively, such that the lifetime of the parasitic minority charge carriers may be reduced and the cross current protection around the first active area 110 and/or laterally around the second active area 120, respectively, may be enhanced.

For example, the semiconductor device 100 comprises a wiring layer stack located on the semiconductor substrate 102. A vertical gap may extend from a surface of the wiring layer stack at least to a portion of a pre-metal insulation layer located above the edge termination doping region 140 or to the semiconductor substrate 102. The vertical gap in the wiring layer stack may laterally extend in circumferential direction along an edge region of the wiring layer stack, such that the vertical gap laterally surrounds all wiring structures comprised by the wiring layer stack. For example, the gap may laterally follow continuously the edge termination doping region 140 located in the semiconductor substrate 102 below the vertical gap.

The vertical gap in the wiring layer stack located above the edge termination doping region 140 may, for example, serve as a crack propagation prevention structure that can stop cracks propagating from singulation edges of the semiconductor die towards wiring structures of the wiring layer stack. The vertical gap in the wiring layer stack may hence increase the reliability (e.g., the lifetime) of the semiconductor device 100 and/or may increase the yield of the semiconductor device 100 during manufacturing and thus decrease manufacturing costs of the semiconductor device 100. The vertical gap in the wiring layer stack may, for example, be filled with (or at least be partially filled with) mold material of a semiconductor package of the semiconductor device 100. For example, the wiring layer stack may be implemented without metal wiring structures above the edge termination doping region 140 (e.g. in a top view of the semiconductor die).

A (minimal, average, or maximal) width of the first doping region 132 of the guard structure may be larger than 5 µm (or larger than 10 µm, larger than 20 µm, or larger than 40 µm) and/or may be less than 50 µm (or less than 30 µm, or less than 15 µm). A larger width of the first doping region 132 of the guard structure may enhance the cross current protection between the first active area 110 and the second active area 120 provided by the guard structure, but may consume more space.

A (minimal, average, or maximal) width of the highly doped portion 152 of the common doping region may be larger than 2 μm (or larger than 5 μm, larger than 15 μm) and/or may be less than 30 μm (less than 20 μm, or less than 10 μm). A larger width of the highly doped portion 152 of the common doping region may reduce the lifetime of the parasitic minority charge carriers flowing between the first active area 110 and the second active area 120 and thus enhance the cross current protection between the first active area 110 and the second active area 120, but may consume more space.

A (minimal, average, or maximal) width of the edge termination doping region 140 may be larger than 500 nm (or larger than 2 μm, or larger than 5 μm) and/or may less than 10 μm (or less than 7 μm, or less than 5 μm). A larger width of the edge termination doping region 140 may enhance the cross current protection between the first active area 110 and the second active area 120.

For example, the width of the first doping region 132 of the guard structure may be at least twice as large as the maximal width of the edge termination doping region 140 and may be at most ten times as large the maximal width of the edge termination doping region 140. In other words, an edge termination doping region 140 whose width is narrower than the width of the first doping region 132 of the guard structure may occupy less lateral area of the semiconductor substrate 102 and hence reduce the size of the semiconductor substrate 102.

A maximal vertical dimension (e.g., a maximal depth) of the first doping region 132 of the guard structure may be larger than 200 nm (or larger than 500 nm, or larger than 2 μm, or larger than 5 μm) and may be smaller than 10 μm (smaller than 7 μm, smaller than 3 μm, or smaller than 1 μm). A deeper first doping region 132 of the guard structure may enhance the cross current protection between the first active area 110 and the second active area 120 provided by the guard structure.

A maximal vertical dimension (e.g., a maximal depth) of the edge termination doping region 140 may be larger than 200 nm (or larger than 500 nm, or larger than 2 μm, or larger than 5 μm) and may be smaller than 10 μm (smaller than 7 μm, smaller than 3 μm, or smaller than 1 μm). A deeper edge termination doping region 140 may enhance the cross current protection between the first active area 110 and the second active area 120 provided by the edge termination doping region 140 in connection with the guard structure.

Moreover, the maximal vertical dimension of the edge termination doping region 140 may be at least half of the maximal vertical dimension of the first doping region 132 of the guard structure and may be at most equal to the maximal vertical dimension of the first doping region 132 of the guard structure. For example, the edge termination doping region 140 and the first doping region 132 of the guard structure may be formed simultaneously by a mutual implantation process during production of the semiconductor substrate 102 of the semiconductor device 100. Furthermore, other doping regions of the first conductivity type comprised by the first active area 110 and/or by the second active area 120 may be formed during said mutual implantation process. By implementing the edge termination doping region 140 together with other doping region, large areas covered by photoresist may be reduced and/or avoided. This may reduce mechanical stresses within the photoresist. The edge termination doping region 140 and the first doping region 132 of the guard structure may comprise substantially (e.g. differs by less than 10%) an equal maximal depth due to an simultaneous implantation of the edge termination doping region 140 and the first doping region 132 of the guard structure. Alternatively, the edge termination doping region 140 may comprise a smaller maximal depth than the first doping region 132 of the guard structure, if the implantation of the edge termination doping region 140 is performed through an insulation layer located on the semiconductor substrate in the region of the edge termination doping region 140 during the implantation, for example.

The doping concentration of the edge termination doping region and/or of the first doping region of the guard structure may be higher than $1*10^{18}$ cm$^{-3}$ (or higher than $1*10^{19}$ cm$^{-3}$, or even higher than $1*10^{20}$ cm$^{-3}$). A maximal doping concentration of the first doping region 132 of the guard structure may be substantially equal (e.g. differs by less than 10%) to a maximal doping concentration of the edge termination doping region. This may, for example, allow forming the first doping region 132 of the guard structure simultaneously with the edge termination doping region 140 during a mutual implantation process. A high doping concentration (e.g., higher than $1*10^{18}$ cm$^{-3}$) of the first doping region 132 of the guard structure and of the edge termination doping region 140 may enable a low resistance and may enhance the cross current protection.

For example, at least one electrical element structure may be located at the first active area 110. The electrical element structure of the first active area 110 may comprise a first doping region (e.g. well doping region or body doping region) of the first conductivity type adjacent to the common doping region. Furthermore, a p-n junction between the first doping region of the electrical element structure of the first active area 110 and the common doping region may be forward biased during the occurrence of reverse operating conditions of the semiconductor device 100. For example, parasitic minority charge carriers that may propagate from the first active area 110 towards the second active area 120 may be injected from the first doping region of the electrical element structure of the first active area 110 into the common doping region during the occurrence of reverse operating conditions of the semiconductor device 100. By the resistive connection 142 existing at least during the occurrence of reverse operating conditions of the semiconductor device 100 between the edge termination doping region 140 and the first doping region 132 of the guard structure, parasitic minority charge carriers traveling through or close to the edge termination doping region 140 may be intercepted by the edge termination doping region 140 and may recombine with charge carriers of opposite polarity provided by the highly doped portion 152 of the common doping region and/or provided by a backside electrode connected at the backside surface of the semiconductor substrate 102 to the common doping region. The backside electrode may be connected to a voltage source and/or a current source. In contrast, the p-n junction between the first doping region of the electrical element structure of the first active area 110 and the common doping region may be reverse biased in a forward operating mode (e.g. off state or blocking state) of the semiconductor device.

For example, a varying potential may occur at a backside electrode (e.g. drain or emitter electrode) being sometimes higher than a front side potential (e.g. source potential) so that forward operating conditions occur and sometimes lower than the front side potential so that reverse operating conditions occur.

The first doping region of the electrical element structure of the first active area 110 may, for example, be a body region of at least one transistor cell of the electrical element structure. The electrical element structure comprising the at least one transistor cell may, for example, be a vertical or lateral transistor (e.g. a double-diffused metal-oxide semiconductor (DMOS) field effect transistor (FET), an insulated gate bipolar transistor IGBT and/or a lateral metal-oxide field effect transistor (MOSFET) and/or a junction gate field effect transistor (JFET) and/or a bipolar transistor). In an application, the electrical element structure of the first active area 110 may, for example, serve to switch load currents applied from external to the semiconductor device 100 to either pass or not to pass through the electrical element structure of the first active area 110. These load currents may, for example, be higher than 500 mA (or higher than 1 A, higher than 5 A, higher than 20 A, or even higher than 40 A). The electrical element structure located at the first active area 110 may, for example, comprise a current path for these load currents from the front side surface of the semiconductor substrate 102 to the backside surface of the semiconductor substrate 102.

Alternatively and/or additionally, the first doping region of the electrical element structure of the first active area 110 may, for example, be an anode region or a cathode region of a diode (e.g., a p-n junction diode). If the first doping region of the electrical element structure of the first active area 110 is, for example, an anode region of a diode, the common doping region of the semiconductor substrate may, for example, represent a cathode region of the diode.

For example, the semiconductor device may be an integrated circuit, a processor device, a memory device, a sensor device or a power semiconductor device. For example, the semiconductor device comprises one or more electrical element structures (e.g. a diode structure or a transistor structure, for example an Insulated-Gate Bipolar Transistor (IGBT) or a Field Effect Transistor (FET)). For example, the (power) semiconductor device may comprise one or more vertical electrical element structures conducting a current (e.g. vertical diode) or controlling a current (e.g. vertical transistor) between a front side of the semiconductor device and a backside of the semiconductor device. A power semiconductor device or an electrical element structure (e.g. one or more electrical element structures of the first and/or second active area) of the power semiconductor device may have a breakdown voltage or blocking voltage of more than 10V (e.g. a breakdown voltage of 10 V, 20 V or 50 V), more than 100 V (e.g. a breakdown voltage of 200 V, 300 V, 400 V or 500 V) or more than 500 V (e.g. a breakdown voltage of 600 V, 700 V, 800 V or 1000 V) or more than 1000 V (e.g. a breakdown voltage of 1200 V, 1500 V, 1700 V, 2000 V, 3300 V or 6500 V), for example.

For example, the second active area 120 of the semiconductor substrate 102 of the semiconductor device 100 may comprise a well doping region of the first conductivity type. Doping regions of electrical elements of a control circuit may be located at the well doping region of the second active area 120. Parasitic minority charge carriers injected into the common doping region from the first active area 110 (e.g., from the first doping region of the electrical element structure of the first active area) may travel through the common doping region towards the well doping region of the second active area 120 and hence towards the doping regions of the electrical elements of the control circuit, where the parasitic minority charge carriers could interfere with the functionality of the control circuit. However, before reaching the well doping region of the second active area 120 and interfering with the functionality of the control circuit, for example, the parasitic minority charge carriers may be intercepted by the first doping region 132 of the guard structure and/or by the edge termination doping region 140 and recombine at least during the occurrence of reverse operating conditions of the semiconductor device 100, when the edge termination doping region 140 is connected via the resistive connection 142 to the first doping region 132 of the guard structure. During the occurrence of reverse operating conditions, the injection of parasitic minority charge carriers may be high compared to other operating conditions of the semiconductor device, because during the occurrence of reverse operating conditions a p-n junction between the first doping region of the electrical element structure of the first active area 110 and the common doping region may be forward biased.

If the electrical element structure of the first active area 110 comprises a transistor, the occurrence of reverse operating conditions may, for example, comprise a reverse-bias and/or reverse-active mode and/or a cut-off mode of the transistor. For example, the electrical element structure of the first active area 110 of the semiconductor substrate 102 of the semiconductor device 100 may comprise an n-channel DMOSFET. During the occurrence of reverse operating conditions of the semiconductor device 100, an electric potential applied to the drain of the DMOSFET (e.g., to a backside electrode located at the backside surface of the semiconductor substrate 102 and connected to the common doping region) may be lower than an electric potential applied to the body region of the DMOSFET and/or applied to the source of the DMOSFET (the body region and/or the source of the DMOSFET may, for example, be contacted by a wiring structure at the front side surface of the semiconductor substrate 102). Moreover, during the occurrence of reverse operating conditions a body diode (e.g., a p-n junction between the body region of the DMOSFET and the common doping region) may be forward-biased.

Additionally and optionally, the control circuit may be configured to provide a gate voltage for the electrical element structure of the first active area 110. For example, the control circuit may detect a control signal applied from an external electrical device to the semiconductor device 100 and may provide a gate voltage of a certain polarity and/or of a certain voltage based on the received control signal. Moreover, the control circuit may comprise a voltage driver stage (e.g., an amplifier) to provide the gate voltage to the electrical element structure of the first active area 110. Alternatively or additionally, the gate voltage may be directly applied from an external electrical device via a gate pin or a gate pad of the semiconductor device 100 connected to a gate of the electrical element structure of the first active area 110.

Optionally, the semiconductor device 100 may be configured to adjust the electric potential of the well doping region of the second active area 120 based on the electric potential of the common doping region at the backside of the semiconductor substrate 102, for example. For example, when the electric potential of the common doping region at the backside of the semiconductor substrate 102 (and/or the electric potential of an optional backside electrode connected to the common doping region at the backside of the semiconductor substrate 102) is at a low positive potential (e.g., between 0 V and 250 mV) or is at some negative potential (e.g., between 0 V and −700 mV) with respect to the potential of the first doping region of the electrical element structure located at the first active area 110, the potential at the well doping region of the second active area 120 differs from the potential of the common doping region at the backside of the semiconductor substrate 102 (and/or from the potential of the optional backside electrode) by less than 20% (or less than 10%, or less than 5%). This may, for example, prevent a forward biasing of a p-n junction between the well doping region of the second active area 120 and the common doping region and may hence make a functioning of the control circuit located at the well doping region of the second active area 120 more reliable. Otherwise, a forward biasing of the p-n junction between the well doping region of the second active area 120 and the common doping region could, for example, occur during the occurrence of reverse operating conditions of the semiconductor device 100.

An active area of a semiconductor substrate of a semiconductor device may be a part of the semiconductor substrate used to conduct a substantial share of a current through the semiconductor substrate in an on-state or conducting state of the semiconductor device. If the semiconductor substrate comprises a plurality of active areas, e.g., two or more active areas, the plurality of active areas (e.g. all active areas of the semiconductor substrate) may conduct, for example, more than 90% of the current through the semiconductor substrate in an on-state or conducting state of the semiconductor device. An active area may comprise a substantial share of circuit elements (e.g., transistor structures) or a substantial share of parts of circuit elements located at the semiconductor substrate. An active area may comprise circuit elements configured to perform or at least partially perform a function characteristic for or substantially needed for the operation of the semiconductor device. For example, an active area may comprise or partially comprise electric circuits or electric element structures integrated into the semiconductor device.

Vertical directions, vertical dimensions (e.g., depths), thicknesses of regions and/or of layers, and thicknesses of structures may, for example, be measured orthogonal to the front side surface of the semiconductor substrate 102. Lateral directions and lateral dimensions (e.g., lengths and widths) may be measured in parallel to the front side surface of the semiconductor substrate 102. If it is referred to a length and/or to a width of a region, of an area, of a structure and/or of a layer, the length designates the longer lateral dimension and the width designates the shorter lateral dimension of the structure and/or of the layer, for example.

For example, in case of a rectangular lateral shape, a width of the rectangular lateral shape may refer to the minimal distance between any pair of parallel edges of the rectangular lateral shape. In case of an annular lateral shape, a lateral ring shape, and/or a lateral loop shape, a width may refer to the difference between the outer circumference and the inner circumference of the annular lateral shape, of the lateral ring shape, and/or of the lateral loop shape, respectively. In this case, the minimal or maximal width of the region, of the structure, and/or of the layer may refer to the largest or smallest width of the region, of the structure, and/or of the layer, respectively, occurring along the region, the structure, and/or the layer, respectively.

A region comprising the first conductivity type may be a p-doped region (e.g. caused by incorporating aluminum ions or boron ions, for example) or an n-doped region (e.g. caused by incorporating nitrogen ions, phosphor ions or arsenic ions, for example). Consequently, the second conductivity type indicates an opposite n-doped region or p-doped region, respectively. In other words, the first conductivity type may indicate a p-doping and the second conductivity type may indicate an n-doping or vice-versa.

The front side surface of the semiconductor substrate may be the surface used to implement more sophisticated and complex structures than at the back side, since the process parameters (e.g. temperature) and the handling may be limited for the back side, if structures are already formed at one side of the semiconductor substrate, for example.

The semiconductor substrate 102 of the semiconductor device 100 may be a silicon substrate. Alternatively, the semiconductor substrate 102 may be a wide band gap semiconductor substrate having a band gap larger than the band gap of silicon (1.1 eV). For example, the semiconductor substrate 102 may be a silicon carbide (SiC)-based semiconductor substrate, or gallium arsenide (GaAs)-based semiconductor substrate, or a gallium nitride (GaN)-based semiconductor substrate. The semiconductor substrate 102 may be a semiconductor wafer or may be comprised by a semiconductor die.

Figure 2:
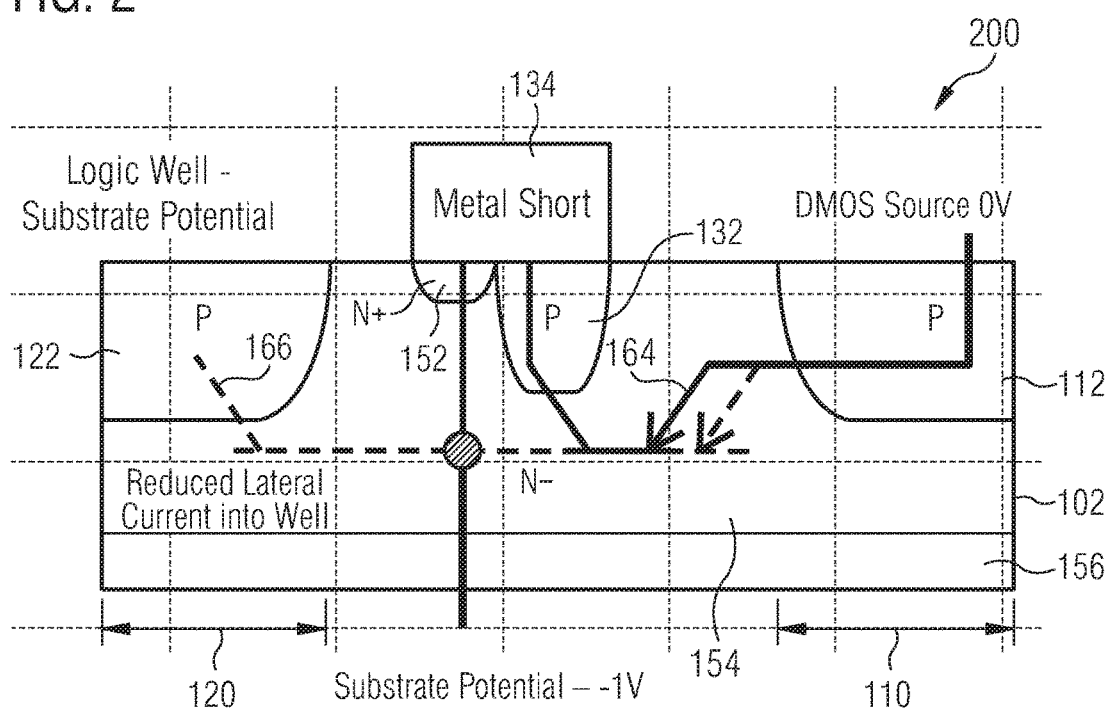
FIG. 2 shows a schematic cross section of a portion of a semiconductor device through a guard structure of the semiconductor device.

FIG. 2 shows a schematic cross section of a portion of a semiconductor device 200 through a guard structure of the semiconductor device 200 amongst others. The semiconductor device 200 as displayed in FIG. 2 may be implemented similar to the semiconductor device 100 of FIG. 1. An electrical element structure (e.g. a DMOSFET) is located at a first active area 110 of the semiconductor substrate 102 of the semiconductor device 200. The electrical element structure of the first active area 110 comprises a p-doped first doping region 112 that may, for example, comprise a body region of a DMOSFET and that is at least partially located at the front side surface of the semiconductor substrate 102.

A common doping region extending at least from a part of the front side surface of the semiconductor substrate 102 to the backside surface of the semiconductor substrate 102 comprises a highly n-doped portion 152 located at the front side surface of the semiconductor substrate 102 and connected via a wiring structure 134 to a p-doped first doping region 132 of a guard structure. The guard structure extends laterally between the first active area 110 and a second active area 120 of the semiconductor substrate 102. The first doping region 132 of the guard structure is laterally located closer to the first active area 110 than the highly n-doped portion 152 of the common doping region. The highly n-doped portion 152 of the common doping region is laterally located closer to the second active area 120 than the first doping region 132 of the guard structure. The first doping region 132 of the guard structure has a larger maximal vertical dimension than the highly n-doped portion 152 of the common doping region.

The common doping region further comprises a lightly n-doped portion 154 that may, for instance, comprise a drift region of the electrical element structure of the first active area. Moreover, the first doping region 112 of the electrical element structure of the first active area 110 extends into the lightly n-doped portion 154 of the common doping region. The common doping region may, for example, also comprise a highly n-doped backside portion 156 located at the backside of the semiconductor substrate 102. The highly n-doped backside portion 156 may, for example, at least partially serve as a drain region of the electrical element structure of the first active area 110. Furthermore, a p-doped well doping region 122 is comprised by the second active area 120. The well doping region 122 of the second active area 120 is located at the front side surface of the semiconductor substrate and extends into the lightly n-doped portion 154 of the common doping region.

In FIG. 2 the semiconductor device 200 is shown in occurrence of reverse operating condition. The common doping region is at a lower electric potential (e.g., at approximately −1 V, for example) than a source region of the electrical element structure of the first active area 110 and/or the first doping region 112 of the electrical element structure of the first active area 110. An optional sensor detecting the potential at the backside of the semiconductor substrate 102 and connected to the highly n-doped backside portion 156 of the common doping region may be at the same or at a similar electric potential as the common doping region. The source region of the electrical element structure of the first active area 110 and/or the first doping region 112 of the electrical element structure of the first active area 110 may, for example, be at an electric potential of approximately 0 V. Hence, a p-n junction between the first doping region 112 of the electrical element structure of the first active area 110 and the lightly n-doped portion 154 of the common doping region may be forward biased, such that parasitic minority charge carriers (e.g., holes) may be injected into the lightly n-doped portion 154 and travel through a parasitic pnp-bipolar transistor 166 towards the well doping region 122 of the second active area 120.

The electric potential of the well doping region 122 of the second active area 120 may, for example, be adjusted by the semiconductor device to an electric potential close to the electric potential of the common doping region, for example, to −900 mV. The adjustment of the electric potential of the well doping region 122 of the second active area 120 may, for example, be accomplished by a vertical bipolar transistor located at the first active area 110 or the second active area 120 of the semiconductor substrate 102. The injected parasitic minority charge carriers traveling towards the well doping region 122 of the second active area 120 may, however, be intercepted by the first doping region 132 of the guard structure. The intercepted parasitic minority charge carriers may then recombine with charge carriers of opposite sign (e.g., electrons) provided by the highly n-doped portion 152. For example, electrons may flow from the highly n-doped backside portion 156, through the lightly n-doped portion 154, through the highly n-doped portion 152 of the common doping region, and into or through the wiring structure 134 to the first doping region 132 of the guard structure, where they may eliminate the parasitic minority charge carriers. Parasitic minority charge carriers not intercepted by the first doping region 132 of the guard structure and traveling towards the second active area 120 may recombine with electrons flowing from the backside electrode towards the highly n-doped portion 152. Hence, the first doping region 132 of the guard structure may form a suppression pnp-bipolar transistor 164 together with the lightly n-doped portion 154 and the first doping region 112 of the first active area 110. In this way, the guard structure may provide protection for the second active area 120 from parasitic minority charge carriers injected into the common doping region by from the first active area 110 during the occurrence of reverse operating conditions of the semiconductor device 200.

Moreover, the first doping region 132 of the guard structure may be connected by a resistive connection to an edge termination doping region (not shown in FIG. 2), such that parasitic minority charge carriers may also be intercepted by the edge termination doping region, which may enhance the cross current protection between the first active area 110 and the second active area 120 within the semiconductor substrate 102.

More details and aspects are mentioned in connection with the embodiments described above or below. The embodiment shown in FIG. 2 may comprise one or more optional additional features corresponding to one or more aspects mentioned in connection with the proposed concept or one or more embodiments described above (e.g. FIG. 1) or below (e.g. FIGS. 3-9).

Figure 3:
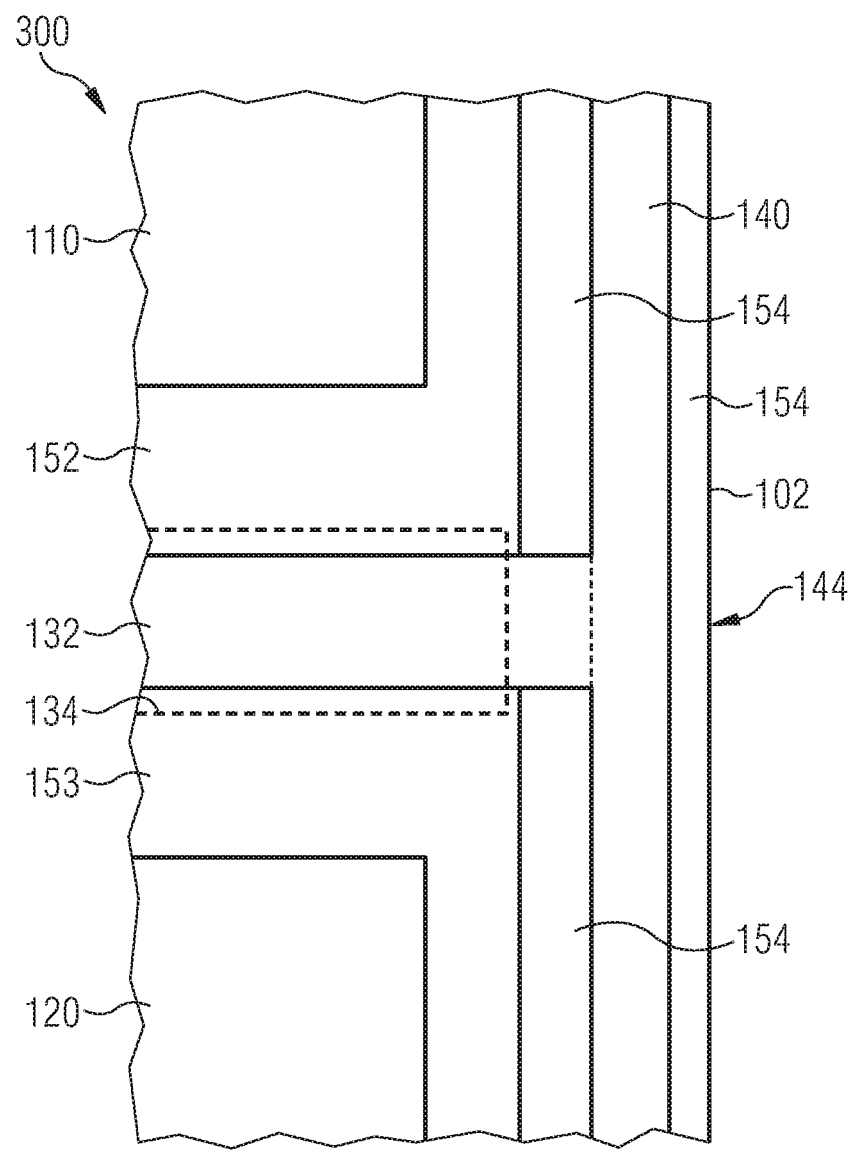
FIG. 3 shows a detailed top view of a portion of a semiconductor device.

FIG. 3 shows a detailed top view of a portion of a semiconductor device 300. The semiconductor device 300 as displayed in FIG. 3 may be similar to the semiconductor device 100 of FIG. 1 and/or to the semiconductor device 200 of FIG. 2. FIG. 3 illustrates an example of how a first doping region 132 of a guard structure can be connected by a resistive connection to an edge termination doping region 140. In the example of FIG. 3, the first doping region 132 of the guard structure directly laterally contacts the edge termination doping region 140, such that the first doping region 132 of the guard structure is short circuited to the edge termination doping region 140. In this way, the first doping region 132 of the guard structure and the edge termination doping region 140 form a continuous doping region of a first conductivity type that laterally entirely surrounds a first active area 110 of a semiconductor substrate 102 of the semiconductor device 300 and that laterally entirely surrounds a second active area 120 of the semiconductor substrate 102. Parasitic minority charge carriers injected, for example, from the first active area 110 into a common doping region may then be prevented from traveling around the guard structure at the lateral ends of the guard structure and thus from traveling to the second active area 120, because at the lateral ends of the guard structure the first doping region 132 of the guard structure directly contacts the edge termination doping region 140. In this way, the edge termination doping region 140 that may extend along singulation edges 144 of the semiconductor substrate 102 and that may be provided for preventing cracks from being initiated at the singulation edges 144 or from traveling from the singulation edges 144 to the first active area 110 and/or to the second active area 120 can be given an additional electrical protection function, which may enhance cross current protection between the first active area 110 and the second active area 120 within the semiconductor substrate 102.

FIG. 3 furthermore shows a first highly doped portion 152 of the common doping region and a second highly doped portion 153 of the common doping region. The first highly doped portion 152 may, for example, laterally surround the first active area 110. The first highly doped portion 152 is laterally located directly between the first active area 110 and the first doping region 132 of the guard structure, and is also laterally located between the first active area 110 and the edge termination doping region 140. A lightly doped portion 154 of the common doping region is partially laterally located directly between the first highly doped portion 152 of the common doping region and the edge termination doping region 140. Alternatively, the first highly doped portion 152 of the common doping region may extend to the edge termination doping region 140. The first highly doped portion 152 of common doping region may be narrower between the first active area 110 and the edge termination doping region 140 than between the first active area 110 and the first doping region 132 of the guard structure. This may save lateral area on the semiconductor substrate 102.

The second highly doped portion 153 may, for example, laterally surround the second active area 120. The second highly doped portion 153 is laterally located directly between the second active area 120 and the first doping region 132 of the guard structure, and may also be laterally located between the second active area 120 and the edge termination doping region 140. The lightly doped portion 154 of the common doping region is also partially laterally located directly between the second highly doped portion 153 of the common doping region and the edge termination doping region 140. Alternatively, the second highly doped portion 153 of the common doping region may extend to the edge termination doping region 140. The second highly doped portion 153 of common doping region may be narrower between the second active area 120 and the edge termination doping region 140 than between the second active area 120 and the first doping region 132 of the guard structure. This may further save lateral area on the semiconductor substrate 102.

A part of the lightly doped portion 154 of the common doping region extends laterally from the edge termination doping region 140 to the singulation edges 144 of the semiconductor substrate 102. Optionally and alternatively, the first highly doped portion 152 and/or the second highly doped portion 153 of the common doping region may extend laterally to one or more singulation edges 144 of the semiconductor substrate 102, such that the edge termination doping region 140 may extend vertically into the first highly doped portion 152 and/or into the second highly doped portion 153 of the common doping region.

Furthermore, FIG. 3 shows a wiring structure 134 that connects the first highly doped portion 152 of the common doping region to the first doping region 132 of the guard structure, and that connects the second highly doped portion 153 of the common doping region to the first doping region 132 of the guard structure. Optionally and additionally, the wiring structure 134 may also be connected to the edge termination doping region 140.

For example, FIG. 3 shows a layout of a semiconductor device. A power device well may be at the top of FIG. 3 (e.g., at the first active area 110) whilst a logic well may be at the bottom (e.g., at the second active area 120). Between the two may be a pnp-suppression structure (e.g., the guard structure together with the first and the second highly doped portion of the common doping region) whose center region (e.g., the first doping region of the guard structure) may be p-doped. The common doping region may be n-doped. The furthest lateral extent of the metal (e.g., the wiring structure 134) towards the singulation edge 144 may be the edge of the active die (e.g., the edges of the first active area 110 and/or of the second active area 120 that are located closest to the singulation edge 144), whilst beyond this towards the singulation edge (e.g., to the right) there may be located a seal ring (e.g., an edge termination doping region 140) which may, for example, be implemented without metal. To provide the seal ring with a guard structure functionality, the p-doped center region of the guard structure may, for example, be electrically connected to the seal ring that may also be p-doped. This may provide a path for minority carriers collected under the seal ring to be transported to the electrically shorted part of the guard structure.

For example, suppression may be even more enhanced, by shorting the p-region in the seal ring to the n-plus-ring (e.g., the first highly doped portion 152 and/or the second highly doped portion 153 of the common doping region) located at the active part of the chip with conductive material (e.g., with metal). In this way, an improved parasitic suppression may be achieved by shorting the n-plus-channel stop (e.g., the first highly doped portion 152 and/or the second highly doped portion 153 of the common doping region) at at least one of the active areas 110, 120 to the p-diffusion in the seal ring via a metal short as this can reduce the resistance between the guard structure diffusions (e.g., between the edge termination doping region 140 and the first highly doped portion 152 and/or the second highly doped portion 153 of the common doping region).

More details and aspects are mentioned in connection with the embodiments described above or below. The embodiment shown in FIG. 3 may comprise one or more optional additional features corresponding to one or more aspects mentioned in connection with the proposed concept or one or more embodiments described above (e.g. FIGS. 1-2) or below (e.g. FIGS. 4-9).

Figure 4:
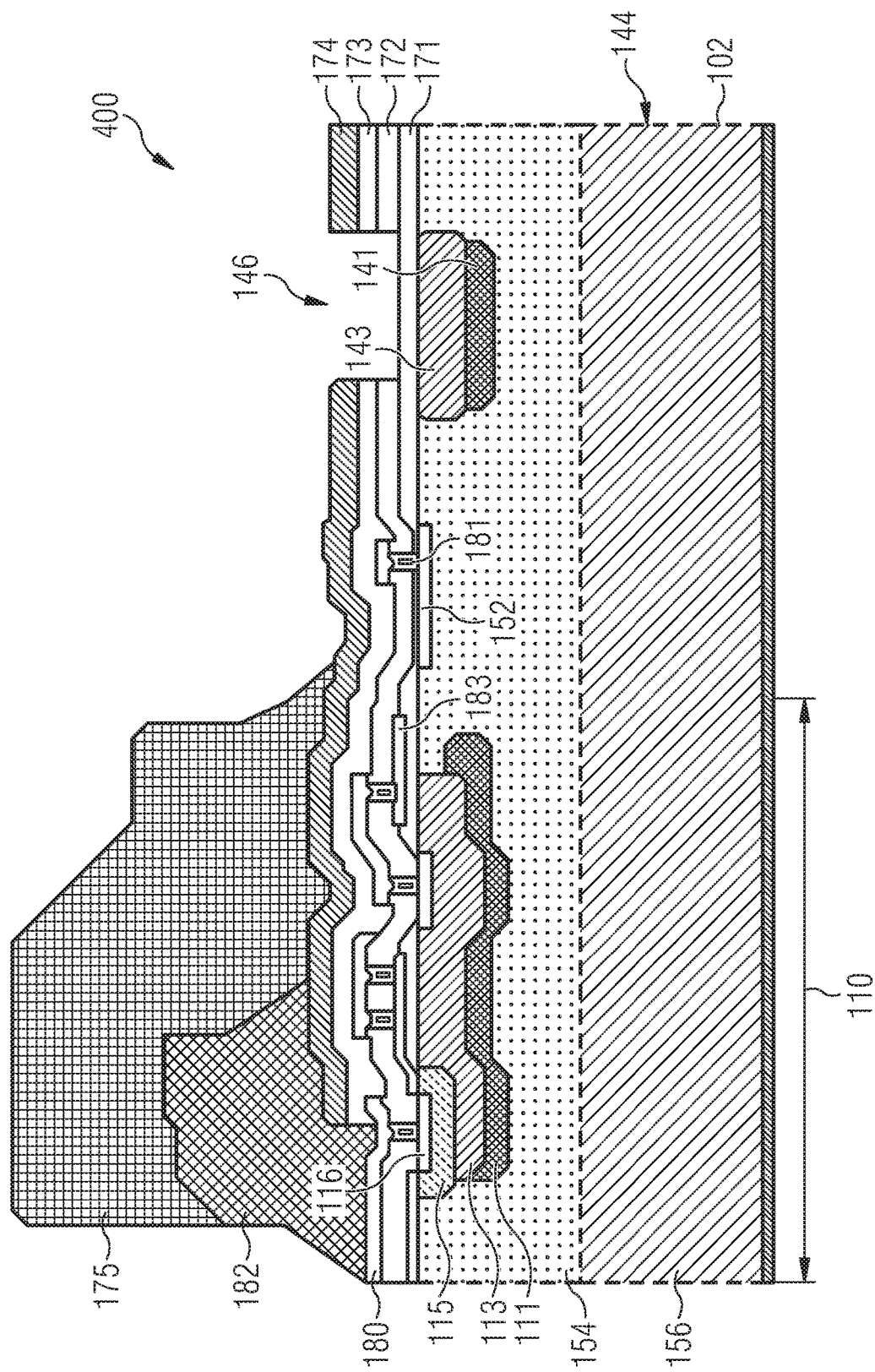
FIG. 4 shows a schematic cross section of a portion of a semiconductor device through an edge termination doping region of the semiconductor device.

FIG. 4 shows a schematic cross section of a portion of a semiconductor device 400. Amongst others, the cross section passes through an edge termination doping, through a first active area 110, and through a common doping region of a semiconductor substrate 102 of the semiconductor device 400. The semiconductor device 400 as displayed in FIG. 4 may be similar to one or more of the semiconductor devices 100, 200, 300 of FIGS. 1-3.

The edge termination doping region comprises a first portion 141 and a second portion 143. The first portion 141 and the second portion 143 of the edge termination doping region extend into a lightly doped portion 154 of the common doping region of the semiconductor substrate 102. The lightly doped portion 154 may comprise a doping concentration of at most $1*10^{18}$ cm$^{-3}$, for example. The first portion 141 and the second portion 143 of the edge termination doping region may be implemented in two implantation process steps and may thus have different doping concentrations.

The first portion 141 of the edge termination doping region may, for example, be implemented simultaneously with a first portion 111 of a first doping region of an electrical element structure located at the first active area 110, and may have substantially the same doping concentration as the first portion 111 of the first doping region of the electrical element structure located at the first active area 110. The first portion 141 of the edge termination doping region and the first portion 111 of the first doping region of the electrical element structure located at the first active area 110 are buried within the semiconductor substrate 102, e.g., located at some distance from a front side surface of the semiconductor substrate 102 and located at some distance from a backside surface of the semiconductor substrate 102.

The second portion 143 of the edge termination doping region may, for example, be implemented simultaneously with a second portion 113 of the first doping region of the electrical element structure located at the first active area 110, and may have substantially the same doping concentration as the second portion 113 of the first doping region of the electrical element structure located at the first active area 110. The second portion 143 of the edge termination doping region extends from the front side surface of the semiconductor substrate 102 into the semiconductor substrate 102 to the buried first portion 141 of the edge termination doping region and is adjacent to it. The second portion 113 of the first doping region of the electrical element structure located at the first active area 110 extends from the front side surface of the semiconductor substrate 102 into the semiconductor substrate 102 to the buried first portion 111 of the first doping region of the electrical element structure located at the first active area 110 and is adjacent to it.

A wiring layer stack is located on the front side surface of the semiconductor substrate 102. The wiring layer stack comprises a first plurality of first lateral wiring elements 180 located at a first lateral wiring layer and comprises at least one second lateral wiring element 182 located at a second lateral wiring layer. The second lateral wiring layer is at least partially located above the first lateral wiring layer and extends at least partially to the first lateral wiring layer. The first lateral wiring layer may, for example, be a logic metal layer, whereas the second lateral wiring layer may, for example, be a power metal layer and may comprise contact pads for external connections of the semiconductor device 400. The lateral wiring layer stack further comprises a plurality of vertical wiring elements 181, e.g., vias. At least some of the vertical wiring elements extend from the first lateral wiring layer to the semiconductor substrate 102 to contact electrical element structures located at the front side surface of the semiconductor substrate 102. Other vertical wiring elements extend to electrodes 183 (e.g., gate electrodes and/or field plates) located above the front side surface of the semiconductor substrate 102 and also comprised by the wiring layer stack.

Moreover, the electrical element structure located at the first active area 110 comprises a second doping region 116 of the second conductivity type extending from the front side surface of the semiconductor substrate 102 into a third portion 115 of the first doping region of the electrical element structure located at the first active area 110. The second doping region 116 of the electrical element structure located at the first active area 110 may, for example, be a source region of a DMOSFET comprised by the electrical element structure located at the first active area 110. The first doping region of the electrical element structure located at the first active area 110 may, for example, be a body region of the DMOSFET. The second doping region 116 of the electrical element structure located at the first active area 110 is contacted by a vertical wiring element that is connected to a lateral wiring element of the first lateral wiring layer. The lateral wiring element of the first lateral wiring layer is connected to a lateral wiring element of the second lateral wiring layer. The lateral wiring element of the second lateral wiring layer may, for example, provide a source contact of the semiconductor device 400 for external connections.

The first doping region of the electrical element structure located at the first active area 110 extends into the lightly doped portion 154 of the common doping region. The common doping region further comprises a highly doped portion 152 located at the front side surface of the semiconductor substrate 102 and extending into the lightly doped portion 154 of the common doping region. The highly doped portion 152 of the common doping region is contacted by a vertical wiring element connected to a lateral wiring element of the first wiring layer, which may, for example, be connected to a first doping region of a guard structure of the semiconductor device 400.

The common doping region further comprises a backside portion 156 located at the backside of the semiconductor substrate 102. The backside portion 156 may be heavily doped (e.g., comprise a doping concentration of at least $1*10^8$ cm$^{-3}$ or higher) and may, for example, comprise a drain region of the electrical element structure located at the first active area 110. The backside portion 156 of the common doping region extends vertically from the backside of the semiconductor substrate to the lightly doped portion 154 of the common doping region. The lightly doped portion 154 may, for example, comprise a drift region of the electrical element structure located at the first active area 110.

The wiring layer stack further comprises a plurality of insulation layers. A first insulation layer 171 is located directly above the semiconductor substrate 102 and may comprise a field oxide layer. At least a portion of the first insulation layer 171 is located (directly) vertically above the second portion 143 of the edge termination doping region. A second insulation layer 172, e.g., an inter-layer dielectric, is located vertically between the first insulation layer 171 and the first wiring layer and/or is located vertically between the first insulation layer 171 and a third insulation layer 173 of the wiring layer stack. At least some of the vertical wiring elements 181 extend vertically through the second insulation layer 172. At least some of the lateral wiring elements 180 are laterally insulated from each other by the third insulation layer 173, e.g., an inter-metal dielectric. The third insulation layer 173 is partially adjacent with the second insulation layer 172 and partially adjacent with the first lateral wiring layer and the second wiring layer. A forth insulation layer 174, e.g., another inter-layer dielectric, is located directly above the third insulation layer. Moreover, a passivation structure 175, e.g., an imide structure, is at least partially located above the forth insulation layer 174 and is at least partially located above the second lateral wiring layer.

The pre-metal insulation layer may laterally extend from under the vertical gap further towards the inside of the semiconductor device 400) and/or further to the outside (e.g. towards the singulation edges of the semiconductor die comprising the wiring layer stack and the semiconductor substrate 102). The pre-metal insulation layer may be vertically located between the semiconductor substrate 102 and a first lateral wiring layer closest to the semiconductor substrate 102 of the wiring layer stack. The pre-metal insulation layer may, for example, comprise and/or be a field oxide layer. A region extending laterally from the vertical gap in the wiring layer stack to the singulation edges and extending vertically from the surface of the wiring layer stack at least to the pre-metal insulation layer may be implemented without wiring structures necessary for the function of the semiconductor device.

A vertical gap 146 extends from a surface of the wiring layer stack to the first insulation layer 171 (e.g., to the field oxide layer). The vertical gap is laterally located at least partially above the edge termination doping region and is vertically separated from the second portion 143 of the edge termination doping region by the first insulation layer 171. Alternatively, the vertical gap may 146 extend also through the first insulation layer 171 to the front side surface of the semiconductor substrate 102 and to the edge termination doping region. Moreover, the vertical gap 146 may slightly extend into the semiconductor substrate 102, for instance, by a vertical distance smaller than 500 nm (or smaller than 1 µm, or smaller than 5 µm, or smaller than 10 µm) and larger than zero. For example, the vertical gap 146 may extend into the edge termination doping region (e.g., into the second portion 143 of the edge termination doping region, and optionally and additionally into the first portion 141 of the edge termination doping region) and/or into the lightly doped portion 154 of the common doping region. The vertical gap 146 may serve as a crack and/or a peeling stopper for cracks or peeling initiated at a singulation edge 144 (e.g., a sawing street) of the semiconductor substrate 102 (or of a semiconductor die comprising the semiconductor substrate 102 and the wiring layer stack) and propagating towards the inside of the semiconductor device 400.

A portion of the wiring layer stack is located laterally between the vertical gap 146 and the singulation edge 144. Said portion of the wiring layer stack does neither comprise any lateral wiring elements nor any vertical wiring elements and hence does not comprise any wiring structures of the wiring layer stack. Said portion of the wiring layer stack may only comprise portions of the first insulation layer 171, and/or portions of the second insulation layer 172, and/or portions of the third insulation layer 173, and/or portions of the fourth insulation layer 174.

Optionally, the edge termination doping region may comprise additional portions of different doping concentrations and located at different vertical distances from the front side surface of the semiconductor substrate 102. Optionally, the edge termination doping region may solely comprise the first, buried portion 141 of the edge termination doping region (or a plurality of buried portions), such that the edge termination doping region is buried within the semiconductor substrate 102. Optionally, the edge termination doping region may only comprise the second portion 143, such that the edge termination doping region may extend to a vertical depth shallower than the first doping region of the electrical element structure located at the first active area or shallower than a first doping region of a guard structure of the semiconductor substrate 102. The edge termination doping region may be configured to reduce mechanical stress caused by resists (e.g., caused by resists during photolithographic production steps of the semiconductor device 400).

More details and aspects are mentioned in connection with the embodiments described above or below. The embodiment shown in FIG. 4 may comprise one or more optional additional features corresponding to one or more aspects mentioned in connection with the proposed concept or one or more embodiments described above (e.g. FIGS. 1-3) or below (e.g. FIGS. 5-9).

Figure 5:
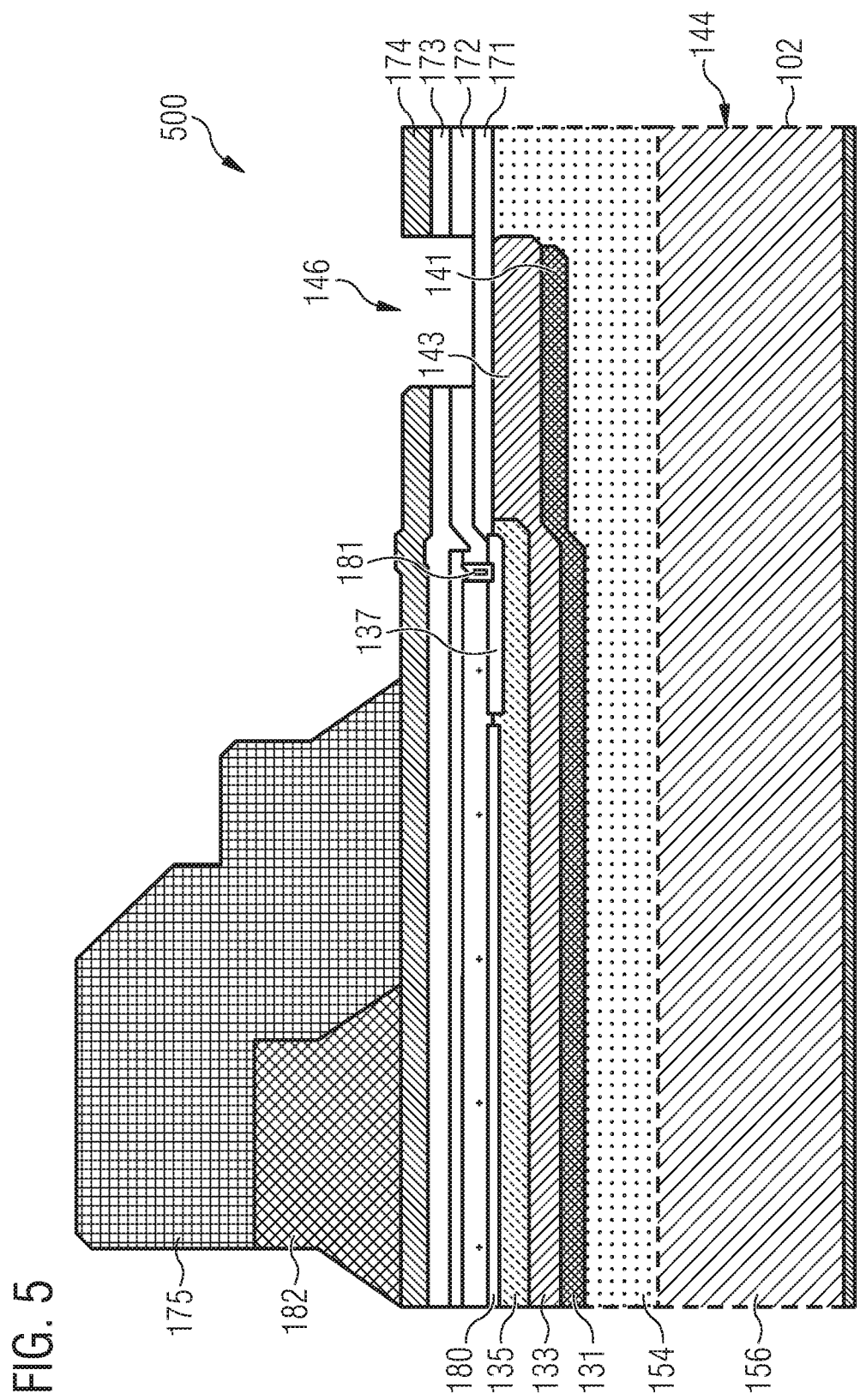
FIG. 5 shows a schematic cross section of a portion of a semiconductor device through a guard structure and an edge termination doping region of the semiconductor device.

FIG. 5 shows a schematic cross section of a portion of a semiconductor device 500. Amongst others, the cross section passes through a guard structure, through an edge termination doping region and through a common doping region of a semiconductor substrate 102 of the semiconductor device 500. The semiconductor device 500 as displayed in FIG. 5 may be similar to semiconductor device 400 of FIG. 4.

The guard structure comprises a first doping region. The first doping region of the guard structure and the edge termination doping region extend from a front side surface of the semiconductor substrate 102 into a lightly doped portion 154 of the common doping region. The first doping region of the guard structure comprises a first portion 131, a second portion 133, a third portion 135, and a contact portion 137. The first doping region of the guard structure is laterally in contact with the edge termination doping region that comprises a first portion 141 and a second portion 143. The first portion 131 of the first doping region of the guard structure goes over into the first portion 141 of the edge termination doping region. The second portion 133 of the first doping region of the guard structure goes over into the second portion 143 of the edge termination doping region. The third portion 135 of the first doping region of the guard structure laterally extends to the second portion 143 of the edge termination doping region. In this way, the first doping region of the guard structure is laterally in (direct) contact with the edge termination doping region.

The first portion 141 of the edge termination doping region comprises a maximal vertical depth smaller than a maximal vertical depth of the first portion 131 of the first doping region of the guard structure, because the first portion 141 of the edge termination doping region may be implanted during the same implantation step as the first portion 131 of the first doping region of the guard structure, wherein the implantation ions of the first portion 141 of the edge termination doping region may have to penetrate through a first insulation layer 171 located on the front side surface of the semiconductor substrate 102 and might hence not reach the same depth as implantation ions of the first portion 131 of the first doping region of the guard structure. The maximal vertical depth of the first portion 141 of the edge termination doping region may, for example, amount to a value between 2.5 µm and 3.5 µm. The maximal vertical depth of the first portion 131 of the first doping region of the guard structure may, for example, amount to a value between 3 µm and 4 µm.

Similarly, the second portion 143 of the edge termination doping region comprises a maximal vertical depth smaller than a maximal vertical depth of the second portion 133 of the first doping region of the guard structure. The maximal vertical depth of the second portion 143 of the edge termination doping region may, for example, amount to a value between 1 µm and 2 µm. The maximal vertical depth of the second portion 133 of the first doping region of the guard structure may, for example, amount to a value between 1.5 µm and 2.5 µm.

The first portion 141 of the edge termination doping region and the first portion 131 of first doping region of the guard structure may comprise the same or a similar maximal doping concentration. For example, the first portion 141 of the edge termination doping region and the first portion 131 of first doping region of the guard structure may be implanted during a deep body implantation step. The maximal doping concentration of the first portion 141 of the edge termination doping region and/or of the first portion 131 of first doping region of the guard structure may, for example, amount to a value between $1*10^{16}$ cm$^{-3}$ and $1*10^{18}$ cm$^{-3}$. Due to the portion of the first insulation layer 171 located above the edge termination doping region, the doping concentration of the first portion 141 of the edge termination doping region may be slightly less than the doping concentration of the first portion 131 of the first doping region of the guard structure (e.g., less by a factor larger than 1 and smaller than 100, or smaller than 10, or smaller than 5).

The second portion 143 of the edge termination doping region and the second portion 133 of the first doping region of the guard structure may comprise the same or a similar maximal doping concentration. For example, the second portion 143 of the edge termination doping region and the second portion 133 of first doping region of the guard structure may be implanted during a medium body implantation step. The maximal doping concentration of the second portion 143 of the edge termination doping region and/or of the second portion 133 of first doping region of the guard structure may, for example, amount to a value between $8*10^{16}$ cm$^{-3}$ and $8*10^{18}$ cm$^{-3}$. Due to the portion of the first insulation layer 171 located above the edge termination doping region, the doping concentration of the second portion 143 of the edge termination doping region may be slightly less than the doping concentration of the second portion 133 of the first doping region of the guard structure (e.g., less by a factor larger than 1 and smaller than 100, or smaller than 10, or smaller than 5).

The third portion 135 of the first doping region of the guard structure may, for example, be implemented during a surface body implantation step and may, for example, have a maximal vertical depth between 500 nm and 1.5 µm. The surface body implantation step may use lower energies for accelerating the implantation ions, such that the implantation ions of the surface body implantation step may only penetrate into the semiconductor substrate 102 where the front side surface of the semiconductor substrate 102 is free of the first insulation layer 171. Hence, implantation ions of the surface body implantation step may be prevented from being implanted into the edge termination doping region that is covered by at least a portion of the first insulation layer 171. An additional photolithographic mask for shielding the edge termination doping region from implantation ions may hence be saved. The third portion 135 of the first doping region of the guard structure may, for example, comprise a doping concentration between $1*10^{17}$ cm$^{-3}$ and $1*10^{19}$ cm$^{-3}$. The third portion 135 of the first doping region of the guard structure is partially located under the first insulation layer 171 due to diffusion. For example, the third portion 135 of the first doping region of the guard structure may laterally extend by a distance between 500 nm and 1.5 μm under the first insulation layer 171 into the second portion 143 of the edge termination doping region.

The contact portion 137 of the first doping region of the guard structure may be implanted during an additional implantation step and may, for example, comprise a maximal doping concentration higher than $1*10^{19}$ cm$^{-3}$. The contact portion 137 of the first doping region of the guard structure extends into the third portion 135 of the first doping region of the guard structure. The contact portion 137 of the first doping region of the guard structure may, for example, extend to a maximal depth between 200 nm and 800 nm. The contact portion 137 of the first doping region of the guard structure is contacted by a wiring structure comprising a lateral wiring element 180 and a vertical wiring element 181. The wiring structure may comprise additional vertical wiring elements to connect the first doping region of the guard structure to a highly doped portion (not shown in FIG. 5) of the common doping region of the semiconductor substrate 102.

The lightly doped portion 154 of the common doping region extending vertically at least from a part of the front side surface of the semiconductor substrate 102 to a backside portion 156 of the common doping region (located at a backside of the semiconductor substrate 102) may comprise an epitaxial layer and may comprise a maximal doping concentration between $1*10^{15}$ cm$^{-3}$ and $1*10^{17}$ cm$^{-3}$. The backside portion 156 of the common doping region may comprise a maximal doping concentration between $1*10$ cm$^{-3}$ and $1*10^{21}$ cm$^{-3}$ (or even higher than $1*10^{21}$ cm$^{-3}$).

More details and aspects are mentioned in connection with the embodiments described above or below. The embodiment shown in FIG. 5 may comprise one or more optional additional features corresponding to one or more aspects mentioned in connection with the proposed concept or one or more embodiments described above (e.g. FIGS. 1-4) or below (e.g. FIGS. 6-9).

Figure 6:
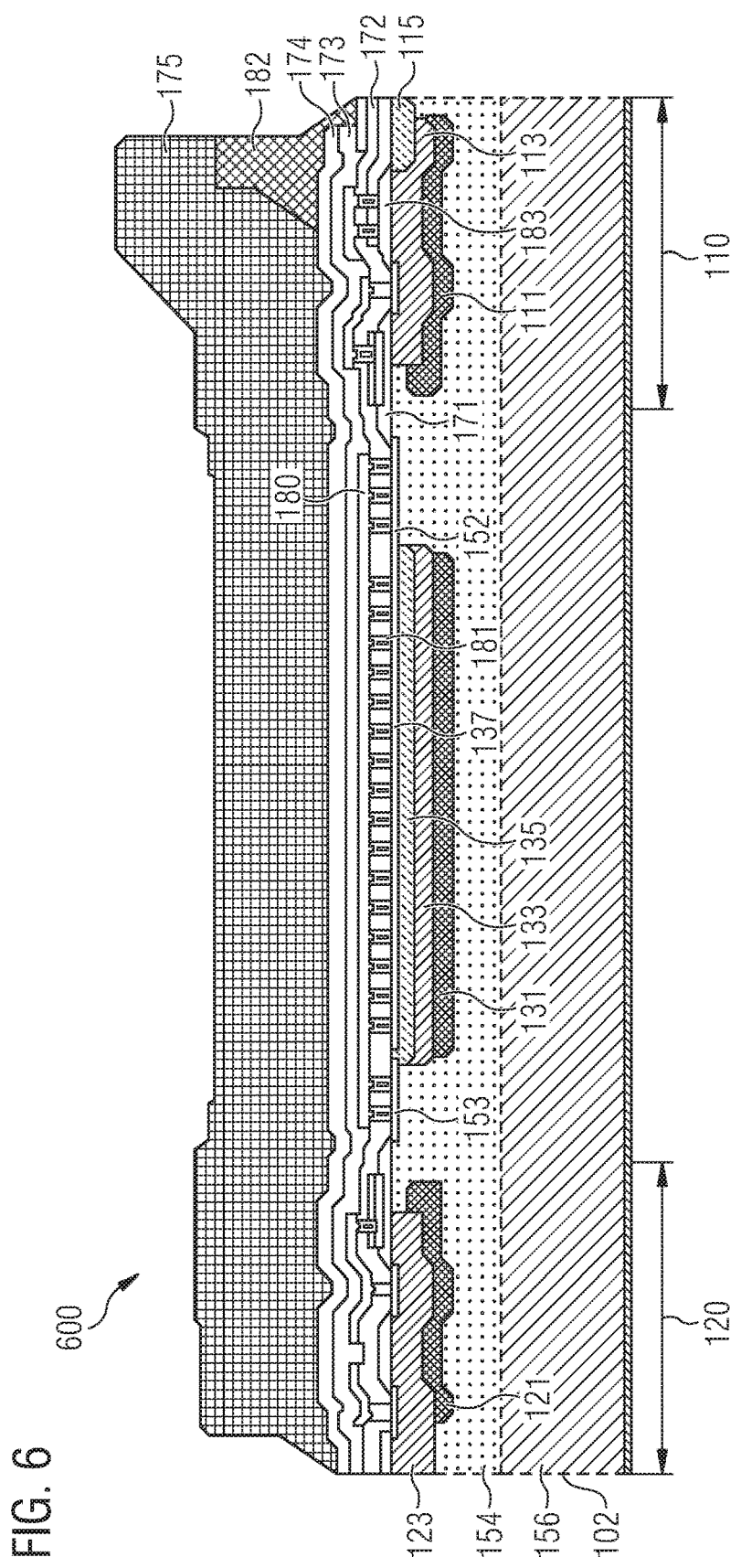
FIG. 6 shows a schematic cross section of a portion of a semiconductor device through a guard structure of the semiconductor device.

FIG. 6 shows a schematic cross section of a portion of a semiconductor device 600. Amongst others, the cross section passes through a guard structure, through a first active area 110, through a second active area 120, and through a common doping region of a semiconductor substrate 102 of the semiconductor device 600. The semiconductor device 600 as displayed in FIG. 6 may be similar to semiconductor device 400 of FIG. 4 and/or to the semiconductor device 500 of FIG. 5.

FIG. 6 shows how the guard structure is arranged laterally between the first active area 110 and the second active area 120 of the semiconductor substrate 102. A first doping region of the guard structure comprises a first portion 131, a second portion 133, a third portion 135, and a contact portion 137. A wiring structure (similar to the wiring structure 134 of the semiconductor device 100 displayed in FIG. 1) electrically connects the first doping region of the guard structure with a first highly doped portion 152 and with a second highly doped portion 153 of the common doping region. To this end, the contact portion 137 is contacted by a plurality of vertical wiring elements 181 (e.g., vias) that are connected to a lateral wiring element 180 (e.g., a lateral metal plane) of a first lateral wiring layer of a wiring layer stack. Additional vertical wiring elements extend from the lateral wiring element 180 to the first highly doped portion 152 of the common doping region and extend to the second highly doped portion 153 of the common doping region. The first highly doped portion 152 and the second highly doped portion 153 of the common doping region are located at the front side surface of the semiconductor substrate 102 and extend into a lightly doped portion 154 of the common doping region. The first highly doped portion 152 of the common doping region is laterally located between the first doping region of the guard structure and the first active area 110. The second highly doped portion 153 of the common doping region is laterally located between the first doping region of the guard structure and the second active area 120. The first highly doped portion 152 and the second highly doped portion 153 of the common doping region may, for example, have a maximal doping concentration larger than $1*10^{17}$ cm$^{-3}$ and smaller than $1*10^{21}$ cm$^{-3}$. Furthermore, the first highly doped portion 152 and/or the second highly doped portion 153 of the common doping region may, for example, extend to a maximal vertical depth larger than 300 nm and smaller than 1 μm.

In the example shown in FIG. 6, the first doping region of the guard structure extends to a maximal vertical depth similar to the maximal vertical depth of a first doping region of an electrical element structure located at the first active area 110. The first doping region of the electrical element structure located at the first active area 110 comprises a first portion 111 and a second 113 (similar to the electrical element structure located at the first active area 110 of the semiconductor device 400 displayed in FIG. 4).

Furthermore, an electrical element structure located at the second active area 120 comprises a first doping region of the first conductivity type. The first doping region of the electrical element structure of the second active area 120 comprises a first portion 121 and a second portion 123. The second portion 123 of the first doping region of the electrical element structure located at the second active area 120 extends from the front side surface of the semiconductor substrate 102 into the lightly doped portion 154 of the common doping region. The first portion 121 of the first doping region of the electrical element structure located at the second active area 120 is buried in the lightly doped portion 154 of the common doping region, and is adjacent to the second portion 123 of the first doping region of the electrical element structure located at the second active area 120, and is at least partially located under the second portion 123 of the first doping region of the electrical element structure located at the second active area 120. The first doping region of the electrical element structure located at the second active area 120 extends to a maximal vertical depth similar to the maximal vertical depth of the first doping region of the guard structure.

By providing a first doping region of a guard structure that extends to a maximal vertical depth similar to the maximal vertical depth of a first doping region of an electrical element structure located at a first active area 110 and similar to the maximal vertical depth of a first doping region of an electrical element structure located at a second active area 120, the guard structure may provide an enhanced cross current protection between the first active area 110 and the second active area 120 within the semiconductor substrate 102 and may intercept parasitic minority charge carriers flowing from one active area towards the other.

Moreover, the first portion 131 of the first doping region of the guard structure may be formed simultaneously (e.g., during a mutual implantation process step) with the first portion 111 of the first doping region of the electrical element structure located at the first active area 110 and/or may be formed simultaneously with the first portion 121 of the first doping region of the electrical element structure located at the second active area 120. The second portion 133 of the first doping region of the guard structure may be formed simultaneously (e.g., during another mutual implantation process step) with the second portion 113 of the first doping region of the electrical element structure located at the first active area 110 and/or may be formed simultaneously with the second portion 123 of the first doping region of the electrical element structure located at the second active area 120.

More details and aspects are mentioned in connection with the embodiments described above or below. The embodiment shown in FIG. 6 may comprise one or more optional additional features corresponding to one or more aspects mentioned in connection with the proposed concept or one or more embodiments described above (e.g. FIGS. 1-5) or below (e.g. FIGS. 7-9).

Figure 7:
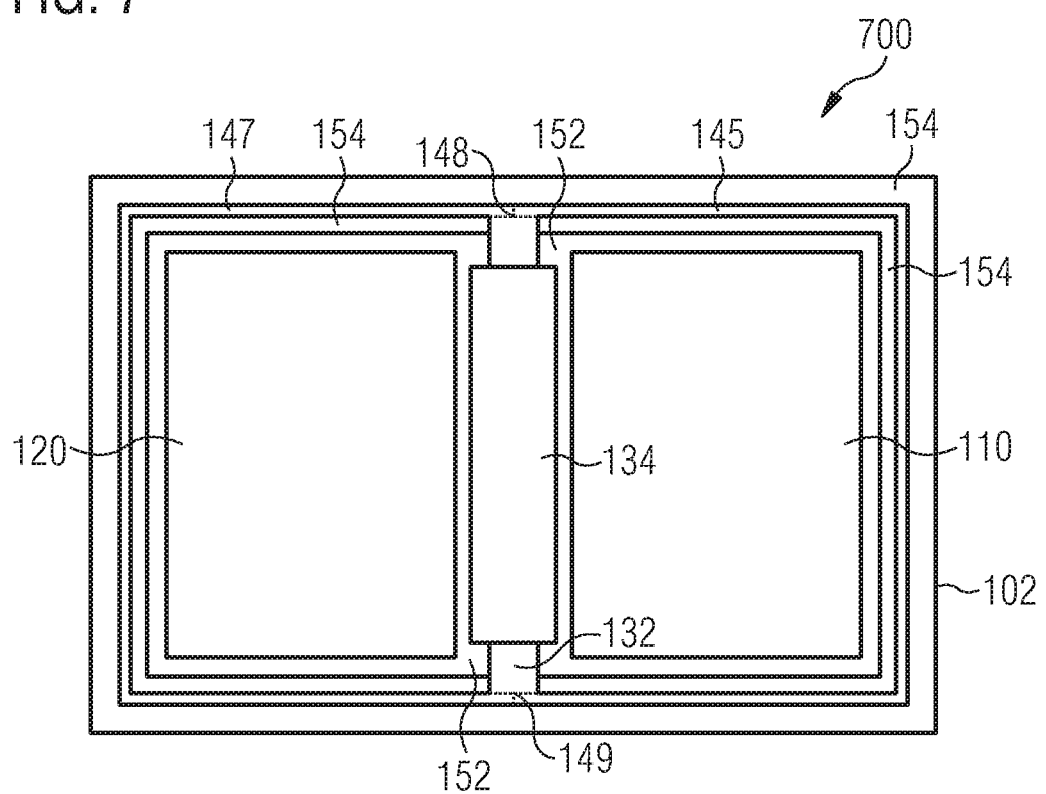
FIG. 7 shows a top view of a semiconductor device comprising a guard structure and an edge termination doping region.

FIG. 7 shows a top view of a semiconductor device 700. The semiconductor device 700 as displayed in FIG. 7 may be similar to the semiconductor device 100 of FIG. 1 and/or to the semiconductor device 300 of FIG. 3 and/or to one or more of the semiconductor devices of FIGS. 4-6.

A semiconductor substrate 102 of the semiconductor device 700 comprises a first active area 110 and a second active area 120. An edge termination doping region laterally surrounds the first active area 110 and the second active area 120. A first doping region 132 of a guard structure is laterally located between the first active area 110 and the second active area 120.

A first lateral part 145 of the edge termination doping region and the first doping region 132 of the guard structure laterally surround the first active area 110 of the semiconductor substrate 102. A second lateral part 147 of the edge termination doping region and the first doping region 132 of the guard structure laterally surround the second active area 120 of the semiconductor substrate 102.

To this end, the edge termination doping region is in shape of a loop laterally surrounding the first active area 110 and the second active area 120. A first end of the first doping region 132 of the guard structure is in direct lateral contact with the edge termination doping region at a first location 148 on the edge termination doping region to provide a first resistive connection between the first doping region 132 of the guard structure and the edge termination doping region. A second end of the first doping region 132 of the guard structure is in direct lateral contact with the edge termination doping region at a second, different location 149 on the edge termination doping region to provide a second resistive connection between the first doping region 132 of the guard structure and the edge termination doping region.

By connecting the first doping region of the guard structure by a resistive connection (e.g., by a direct lateral contact) to the edge termination doping region at at least two ends (e.g., at both ends) of the first doping region 132 of the guard structure, an enhanced cross current protection between the first active area 110 and the second active area 120 within the semiconductor substrate 102 may be provided. In this way, parasitic minority charge carriers may be prevented from flowing around the guard structure at the ends of the first doping region of the guard structure from one active area to the other active area. Parasitic minority charge carriers might not be able to flow anymore through the edge termination doping region, but may be intercepted by the edge termination doping region and recombine with charge carriers of opposite polarity, as described above.

At least one of the first lateral part 145 of the edge termination doping region and the second lateral part 147 of the edge termination doping region may comprise a first portion and a second portion, similar to the first portion and the second portion of the edge termination doping region of the semiconductor device 400 of FIG. 4 and/or similar to the first portion and the second portion of the edge termination doping region of the semiconductor device 500) of FIG. 5. Optionally, the edge termination doping region of the semiconductor device 700 may comprise additional portions of different doping concentrations and extending to different vertical distances within the semiconductor substrate 102. Moreover, at least one of the first lateral part 145 of the edge termination doping region and the second lateral part 147 of the edge termination doping region may be buried within the semiconductor substrate 102.

More details and aspects are mentioned in connection with the embodiments described above or below. The embodiment shown in FIG. 7 may comprise one or more optional additional features corresponding to one or more aspects mentioned in connection with the proposed concept or one or more embodiments described above (e.g. FIGS. 1-6) or below (e.g. FIGS. 8-9).

Figure 8:
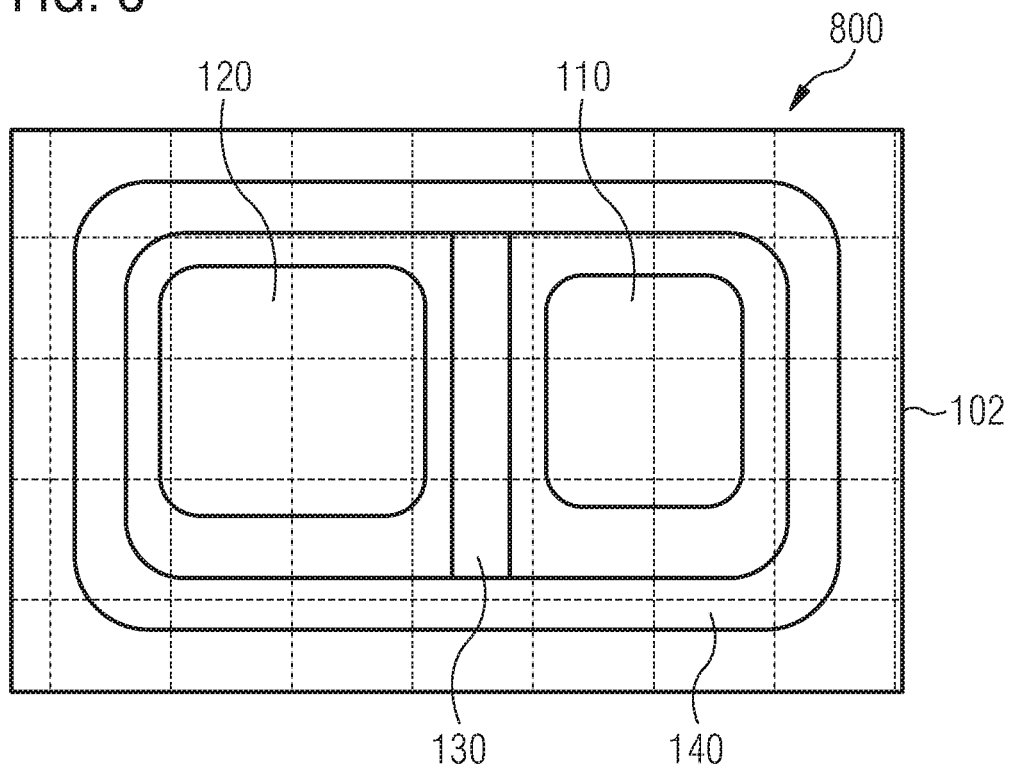
FIG. 8 shows a top view of a semiconductor device comprising a guard structure and an edge termination doping region.

FIG. 8 shows a top view of a semiconductor device 800 comprising a guard structure 130 and an edge termination doping region 140. The semiconductor device 800 as displayed in FIG. 8 may be similar to the semiconductor device 100 of FIG. 1 and/or to the semiconductor device 700 of FIG. 7.

The guard structure 130 is laterally located between a first active area 110 and a second active area 120 of a semiconductor substrate 102 of the semiconductor device 800. A first doping region of the guard structure contacts the edge termination doping region 140 at a first end of the first doping region of the guard structure and at a second end of the first doping region of the guard structure, similar to the first doping region of the guard structure of the semiconductor device 700 of FIG. 7. The edge termination doping region 140 laterally surrounds the first active area 110 and the second active area 120 of the semiconductor substrate 102 of the semiconductor device 800.

A highly doped portion of a common doping region of the semiconductor substrate 102 may extend laterally in parallel to the first doping region of the guard structure and may optionally extend laterally in parallel to the edge termination doping region 140. In this way, the first doping region of the guard structure may be connected to the highly doped portion of the common doping region by a wiring structure at positions located laterally between the first active area 110 and the second active area 120. Additionally, the edge termination doping region 140 may be connected by the same wiring structure (that connects the first doping region of the guard structure to the highly doped portion of the common doping region) and/or by additional wiring structures at a plurality of positions laterally surrounding the first active area 110 and the second active area 120. This may provide an enhanced cross current protection of the first active area 110 and of the second active area 120 within the semiconductor substrate 102.

More details and aspects are mentioned in connection with the embodiments described above or below. The embodiment shown in FIG. 8 may comprise one or more optional additional features corresponding to one or more aspects mentioned in connection with the proposed concept or one or more embodiments described above (e.g. FIGS. 1-7 or below (e.g. FIG. 9)).

Figure 9:
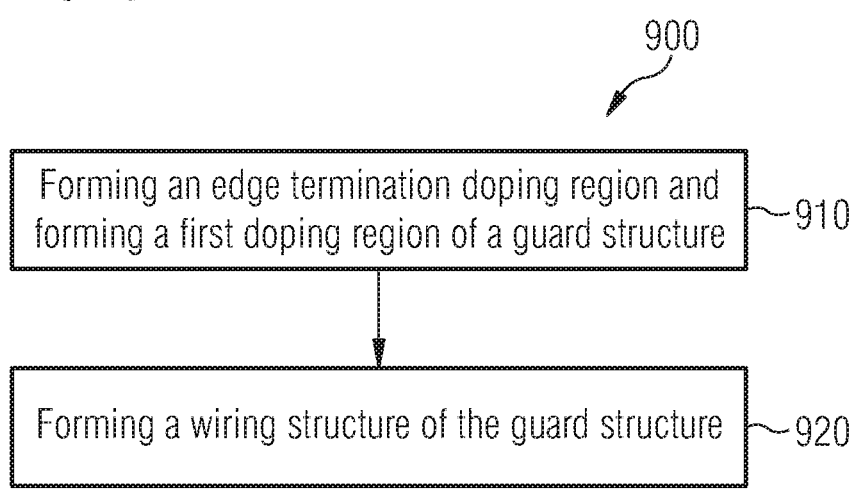
FIG. 9 shows a flow chart of a method for forming a semiconductor device.

FIG. 9 shows a flow chart of a method (900) for forming a semiconductor device. The method (900) comprises forming (910) an edge termination doping region laterally surrounding a first active area of a semiconductor substrate of the semiconductor device and a second active area of the semiconductor substrate of the semiconductor device and forming a first doping region of a guard structure located at a front side surface of the semiconductor substrate. Furthermore, the method (900) comprises forming (920) a wiring structure of the guard structure. The wiring structure of the guard structure electrically connects the first doping region of the guard structure to a highly doped portion of a common doping region. The common doping region extends from a backside surface of the semiconductor substrate to at least a part of the front side surface of the semiconductor substrate in contact with the wiring structure of the guard structure. The guard structure is located laterally between the first active area and the second active area. The edge termination doping region and the first doping region of the guard structure comprise a first conductivity type. The common doping region comprises a second conductivity type. A resistive connection exists between the edge termination doping region and the first doping region of the guard structure at least during occurrence of reverse operating conditions of the semiconductor device.

Forming the edge termination doping region and forming the first doping region of the guard structure may comprise implanting of dopants (e.g., aluminum ions or boron ions, for example) into the semiconductor substrate. The edge termination doping region and the first doping region of the guard structure may, for example, be formed during a mutual implantation process.

By implementing a guard structure that is resistively connected to an edge termination doping region of a semiconductor substrate of a semiconductor device at least during occurrence of reverse operating conditions of the semiconductor device, an enhanced cross current protection between a first active area and a second active area of a semiconductor substrate of the semiconductor device may be provided within the semiconductor substrate. Hence, the semiconductor device may operate more reliably.

More details and aspects are mentioned in connection with the embodiments described above or below. The embodiment shown in FIG. 9 may comprise one or more optional additional features corresponding to one or more aspects mentioned in connection with the proposed concept or one or more embodiments described above (e.g. FIGS. 1-8).

Some embodiments relate to a combined seal ring and a parasitic suppression guard ring construction (e.g., a limes structure).

For example, smart technologies may include a vertical power device such as a power DMOS (e.g., a double-diffused metal-oxide semiconductor field effect transistor) and at least one logic well. When the power device may, for example, be reverse biased the substrate may be at a negative potential but the front surface of the power device and logic well may be both around 0 V. This may cause a current to flow through both of these into the substrate. However, allowing the logic well to forward bias in this way may interfere with its functionality.

The logic well may be switched close to the substrate potential whenever the substrate is reverse biased. However, this may only be partially effective because a percentage of this minority carrier current may still flow out of the power device and into the logic well through a lateral parasitic pnp-bipolar transistor (or a lateral parasitic npn-bipolar transistor). This lateral parasitic current may be suppressed through the guard ring construction.

Furthermore, the present disclosure relates to a more space efficient guard ring construction (e.g., a more space efficient guard structure). The active part (e.g., the first active area and the second active area) of the semiconductor die may be surrounded by a seal ring (e.g., an edge termination doping region) and this seal ring may be given a guard ring construction functionality (e.g., a guard structure functionality and hence a cross current protection functionality). This may be effective when combined with smart technologies which may minimize die area through a reduced well count.

Smart technologies may combine a vertical DMOS in which the DMOS drain may be the wafer substrate with logic. These technologies may, for example, need to function with a negatively biased substrate with respect to the source and logic wells. However, this may forward bias the logic well preventing correct functionality of the logic.

This may be partially overcome by switching the logic well(s) close to the substrate potential during this mode (e.g., during occurrence of reverse operating conditions of the semiconductor device). However, there may still be a parasitic pnp-bipolar transistor (or a parasitic npn-bipolar transistor) between the DMOS and Logic Wells which may inject sufficient minority current into the Logic Well to disturb or prevent its functionality.

A protection structure (e.g., a guard structure) around sensitive logic wells may suppress this parasitic pnp-bipolar transistor (or the parasitic npn-bipolar transistor, respectively). A p-diffusion (e.g., a first doping region of a guard structure and/or an edge termination doping region) may surround sensitive logic wells and may intercept the minority carriers injected from the DMOS reverse biased wells which would otherwise travel to the logic well. This p-diffusion may be connected to an adjacent n-plus-diffusion (e.g., a highly doped portion of a common doping region) with a metal short (e.g., a wiring structure) so that this minority current may be converted into a majority carrier current which might not be able to enter the protected logic well and may travel instead through the substrate.

In some examples, the logic may be divided into a large number of wells (sometimes one well per device) between which the substrate potential may reach the front silicon surface. This may support the implementation of a guard ring construction (e.g., a guard structure) comprising, for example, a pnp-suppression structure. So in these technologies sensitive logic areas may be surrounded with a guard ring construction, e.g., a pnp-suppression protection.

In some examples, the entire logic may be contained in a single well, or in a small number of wells, to minimize chip area. For example, all of the logic may be within a single well (the single logic well being, for example, comprised by a second active area of the semiconductor substrate) whilst the DMOS may be in another well (the DMOS well being, for example, comprised by a first active area of the semiconductor substrate). So for these reduced well count technologies the pnp-suppression structure (e.g., the guard structure) might not be placed around sensitive logic because the required substrate potential might not be available on the top silicon surface (e.g., at the front side surface of the semiconductor substrate) between devices. A possible option may be to place the pnp-suppression structure (e.g., the guard structure) between the DMOS and logic wells. To prevent parasitic pnp current from passing around the pnp-suppression structure (e.g., the guard structure), for example, at the die edge, through the seal ring (e.g., the edge termination doping region), the seal ring may be provided with a guard structure functionality so that the parasitic current may, for example, be prevented from using this route.

When the semiconductor device contains very few logic wells, it might no longer be possible to encircle only sensitive circuitry within the logic with a guard structure. For example, for a semiconductor device containing only one logic well, entirely or largely surrounding the logic well with a guard structure would consume considerable silicon area (if the guard structure is, for example, 30 µm wide, the chip may need to be 60 µm wider).

However, according to at least some examples of the present disclosure, the guard structure may be positioned only between the DMOS and logic wells. This might not be feasible with other semiconductor devices because the parasitic current would flow from the DMOS to the logic well by travelling around the guard structure causing circuit malfunctions either directly or by triggering parasitic devices.

According to an example, the active part of the die (e.g., the first active area and the second active area of the semiconductor substrate comprised by the die) may be surrounded by a seal ring (e.g., an edge termination doping region). The seal ring may, for example, prevent oxide cracks penetrating into the active part of the die from the die edge (e.g., from singulation edges). Cracks may appear at the die edge because they may be caused by the die separation technique, for example wafer sawing. So the seal ring may protect the active part of the die from damage during the separation method.

Because the seal ring may contain oxide cracks it may be electrically inactive because a crack could make a silicon junction leaky. However, in the case of a guard structure the p-region (e.g., the first doping region of the guard structure) may be already electrically shorted (e.g., resistively connected) to the surrounding n silicon region (e.g., the highly doped portion of the common doping region) via metal in the guard structure so an electrical short across the junction may already exist.

According to at least some examples of the present disclosure, the seal ring may be additionally made electrically active by giving it a guard structure capability. For example, the seal ring may be electrically connected to the guard structure (e.g., to the first doping region of the guard structure) by joining existing diffusions. This may suppress parasitic current flowing within the seal ring. For example, a seal ring electrically connected to the guard structure may additionally reduce the number of parasitic minority charge carries flowing between the first active area and the second active area of the semiconductor device by a factor larger than 10 (or larger than 100, or even larger than 1000). Thus, an improvement of several orders of magnitude in the suppressed parasitic current entering the logic well may be achieved when an active seal ring is included in the semiconductor substrate, e.g., when the seal ring is electrically connected to the guard structure.

In reduced well count technologies, the parasitic suppression structure (e.g., the guard structure) may be placed right across the chip. For example, some semiconductor devices may contain one logic well and a DMOS well. To prevent the parasitic current from traveling around the guard structure, the center of the guard structure (e.g., the first doping region of the guard structure) that may be in shape of p-doped stripe may be connected to the seal ring (e.g., to the edge termination doping region) which may also contain a p-doped stripe. Additionally, the logic and DMOS wells may be terminated with an n-plus-channel stop (e.g., the highly doped portion of the common doping region) which may double as the n-connection to the guard structure.

The electrical connection (e.g., the resistive connection between the first doping region of the guard structure and the seal ring) may allow the seal ring to collect parasitic current and transport it to the guard structure for elimination. This may prevent the parasitic current from travelling around the guard structure through the seal ring.

For example, a seal ring (e.g., an edge termination doping region) may be electrically connected to a guard structure (e.g., a first doping region of the guard structure) by joining the diffusions (e.g., the diffusion of the edge termination doping region with the diffusion of the first doping region of the guard structure) so that the seal ring can suppress parasitic currents.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A semiconductor device, comprising:
   a guard structure located laterally between a first active area of a semiconductor substrate and a second active area of the semiconductor substrate, the guard structure comprising a first doping region located at a front side surface of the semiconductor substrate and a wiring structure electrically connecting the first doping region to a highly doped portion of a common doping region, the common doping region extending from a backside surface of the semiconductor substrate to at least a part of the front side surface of the semiconductor substrate in contact with the wiring structure of the guard structure.

2. The semiconductor device of claim 1, further comprising:
   an edge termination doping region extending laterally along a first pair of opposing sides of the first active area and extending laterally along a first pair of opposing sides of the second active area,
   wherein the edge termination doping region and the first doping region of the guard structure comprise a first conductivity type and the common doping region comprises a second conductivity type.

3. The semiconductor device of claim 2, wherein a resistive connection between the edge termination doping region and the first doping region of the guard structure is present at least during reverse operating conditions of the semiconductor device.

4. The semiconductor device of claim 3, wherein the resistive connection is present during any operating condition of the semiconductor device.

5. The semiconductor device of claim 2, wherein the first doping region of the guard structure is in contact with the edge termination doping region so that the first doping region of the guard structure and the edge termination doping region are short circuited.

6. The semiconductor device of claim 2, wherein a lateral part of the edge termination doping region and the first doping region of the guard structure laterally surround the first active area.

7. The semiconductor device of claim 2, further comprising a wiring layer stack disposed on the semiconductor substrate, wherein a vertical gap extends from a surface of the wiring layer stack at least to a portion of a pre-metal insulation layer located above the edge termination doping region.

8. The semiconductor device of claim 2, further comprising a wiring layer stack disposed on the semiconductor substrate, wherein the wiring layer stack is devoid of metal wiring structures above the edge termination doping region.

9. The semiconductor device of claim 2, wherein the edge termination doping region extends laterally along a second pair of opposing sides of the first active area and extends laterally along a second pair of opposing sides of the second active area.

10. The semiconductor device of claim 9, wherein the second pair of opposing sides of the first active area extends in a direction transverse to the first pair of opposing sides of the first active area, and wherein the second pair of opposing sides of the second active area extends in a direction transverse to the first pair of opposing sides of the second active area.

11. The semiconductor device of claim 2, wherein the edge termination doping region extends laterally along three sides of the first active area and along three sides of the second active area.

12. The semiconductor device of claim 1, wherein the highly doped portion of the common doping region laterally surrounds at least one of the first active area and the second active area.

13. The semiconductor device of claim 1, further comprising a wiring layer stack disposed on the semiconductor substrate, wherein a vertical gap extends from a surface of the wiring layer stack at least to a portion of a pre-metal insulation layer located above a surface of the semiconductor substrate.

14. The semiconductor device of claim 1, wherein at least one electrical element structure is located at the first active area, wherein the at least one electrical element structure comprises a first doping region of the first conductivity type adjacent to the common doping region, wherein during reverse operating conditions of the semiconductor device a p-n junction between the first doping region of the at least one electrical element structure and the common doping region is forward biased.

15. The semiconductor device of claim 14, wherein the first doping region of the at least one electrical element structure is a body region of at least one transistor cell of the at least one electrical element structure.

16. A method for forming a semiconductor device, the method comprising:
    forming a first doping region of a guard structure located at a front side surface of a semiconductor substrate, the semiconductor substrate including a first active area of the semiconductor device and a second active area of the semiconductor device; and
    forming a wiring structure of the guard structure electrically connecting the first doping region of the guard structure to a highly doped portion of a common doping region, the common doping region extending from a backside surface of the semiconductor substrate to at least a part of the front side surface of the semiconductor substrate in contact with the wiring structure of the guard structure, the guard structure being located laterally between the first active area and the second active area.

17. The method of claim 16, further comprising:
forming an edge termination doping region which extends laterally along a first pair of opposing sides of the first active area and extends laterally along a first pair of opposing sides of the second active area,
wherein the edge termination doping region and the first doping region of the guard structure comprise a first conductivity type and the common doping region comprises a second conductivity type.

18. The method of claim 17, wherein the edge termination doping region extends laterally along a second pair of opposing sides of the first active area and extends laterally along a second pair of opposing sides of the second active area.

19. The method of claim 18, second pair of opposing sides of the first active area extends in a direction transverse to the first pair of opposing sides of the first active area, and wherein the second pair of opposing sides of the second active area extends in a direction transverse to the first pair of opposing sides of the second active area.

20. The method of claim 18, wherein the edge termination doping region extends laterally along three sides of the first active area and along three sides of the second active area.

* * * * *

UNITED STATES PATENT AND TRADEMARK OFFICE
CERTIFICATE OF CORRECTION

PATENT NO.       : 10,199,490 B2  
APPLICATION NO.  : 15/915890  
DATED            : February 5, 2019  
INVENTOR(S)      : A. Finney et al.

Page 1 of 1

It is certified that error appears in the above-identified patent and that said Letters Patent is hereby corrected as shown below:

At Column 35, Line 23 (Claim 19, Line 1), please insert --wherein the-- before second.

Signed and Sealed this  
Thirteenth Day of August, 2019

Andrei Iancu  
*Director of the United States Patent and Trademark Office*